United States Patent
Arsintescu

(10) Patent No.: US 6,671,866 B2
(45) Date of Patent: Dec. 30, 2003

(54) DEVICE LEVEL LAYOUT OPTIMIZATION IN ELECTRONIC DESIGN AUTOMATION

(75) Inventor: Bodgan Arsintescu, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 188 days.

(21) Appl. No.: 09/797,386

(22) Filed: Feb. 28, 2001

(65) Prior Publication Data

US 2001/0034873 A1 Oct. 25, 2001

Related U.S. Application Data

(60) Provisional application No. 60/185,826, filed on Feb. 29, 2000.

(51) Int. Cl.$^7$ ................................................. G06F 17/50
(52) U.S. Cl. .................................. 716/10; 716/9; 716/8
(58) Field of Search ........................................ 716/1–14

(56) References Cited

PUBLICATIONS

Hwang et al., "An Optimal Transistor–Chaining Algorithm for CMOS Cell Layout", Nov. 1989, IEEE International Conference on Computer–Aided Design, Digest of Technical Papers, pp. 344–347.*

Hwang, Chi–Yi, et al., "A Fast Transistor–Chaining Algorithm for CMOS Cell Layout," IEEE Trans. on Computer Aided Design, vol. 9, No. 7, Jul. 1990, pp. 781–786.

Maziasz, Robert, et al., "Layout Optimization of Static CMOS Functional Cells," IEEE Trans. on Computer Aided Design, vol. 9, No. 7, 1990, pp. 708–719.

Malavasi, Enrico, et al., "Optimum CMOS Stack Generation with Analog Constraints," IEEE Trans. on Computer–Aided Design, vol. 14, No. 1, Jan. 1995, pp. 107–122.

Arsintescu, Bogdan, et al., "Global Stacking for Analog Circuit," Proceedings EURO–DAC '96, European Design Automation Conference with EURO–VHDL '96 and Exhibition, Sep. 16–20, 1996, pp. 392–397.

Basaran, Bulent, et al., "An O(n) Algorithm for Transistor Stacking with Performance Constraints," 33$^{rd}$ Design Automation Conference Proceedings 1996, pp. 221–226.

Fiduccia, C.M., et al., "A Linear–Time Heuristic for Improving Network Partitions," ACM IEEE Nineteenth Design Automation Conference Proceedings, Jun. 14–16, 1982, pp. 175–181.

(List continued on next page.)

Primary Examiner—Vuthe Siek
Assistant Examiner—Sun James Lin
(74) Attorney, Agent, or Firm—Bingham McCutchen LLP

(57) ABSTRACT

According to a custom physical design process for integrated circuits, a method is provided for creating layouts characterized by optimal-length chains for different types of MOS circuit designs, including mixed-signal MOS designs. A chaining engine having a device library and operating on a computer converts a circuit representation such as a netlist file into a layout file characterized by optimal-length chains. Such conversion may be accomplished in linear time. From a circuit representation, a bipartite graph is prepared. A starting node in the bipartite graph is selected according to enumerated Euler trail algorithm rules. A constraint greedy walk is conducted to generate layout chains, and is preferably repeated until the bipartite graph is exhausted of edges, at which point the resulting layouts are returned. A single optimal layout solution can be obtained without enumerating all the possible layout options, resulting in a considerable speed advantage over conventional techniques. The disclosed chaining methods may be used, for example, in both customizing layouts and in creating automated layouts when enhanced with optional partitioning and/or folding capabilities.

25 Claims, 22 Drawing Sheets

OTHER PUBLICATIONS

Stravers, Paul, "Partitioning a network into n pieces with a time–efficient net cost function," Proceedings of Design Automation Conference, 1991, pp. 177–182.

Maziasz, Robert L., et al., "Layout Minimization of CMOS Cells," Kluwer Academic Publishers, Boston, MA, 1992.

A. Joseph Velasco, et al, "A combined pairing and chaining algorithm for CMOS layout generation" European Design and Test Conference, 1996. ED&TC. Proceeding Paris, France Mar. 11–14, 1996, Los Alamitos, Ca USA IEEE Comput Soc., p. 609.

Chi–Yi Hwang, et al, "A Fast Transistor–Chaining Algorithm for CMOS Cell Layout" IEEE Transactions on Computer Aided Design of Integrated Circuits and Systems, IEEE Inc. New York, US, vol. 9, No. 7, Jul. 1, 1990, pp. 781–786.

* cited by examiner

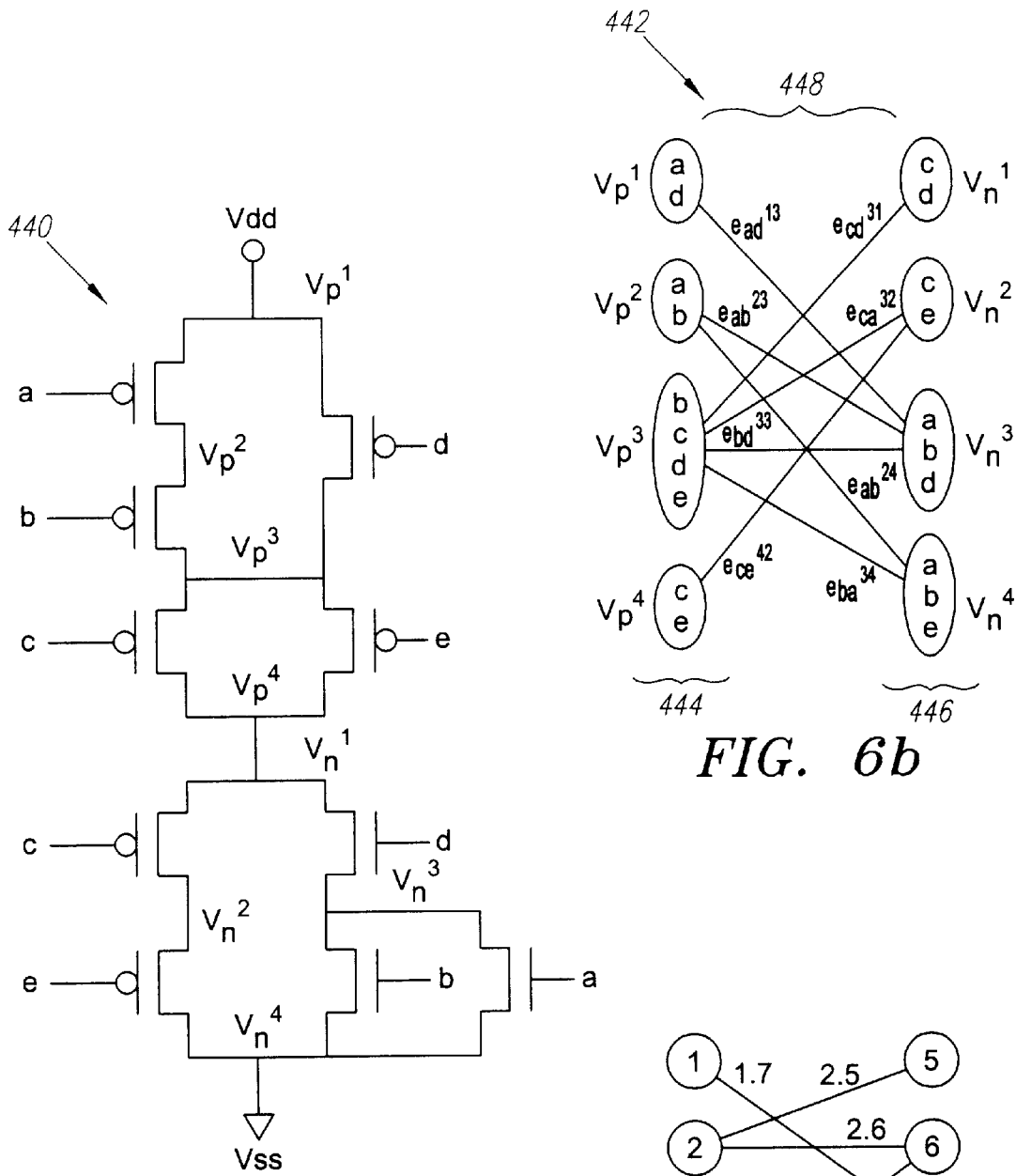
FIG. 6b
FIG. 6a
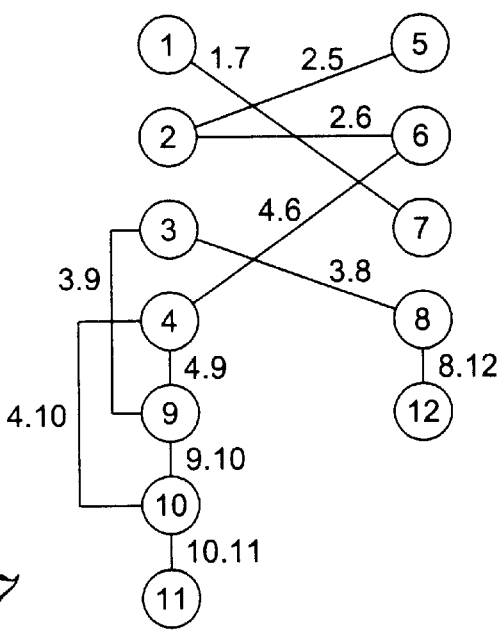
FIG. 7

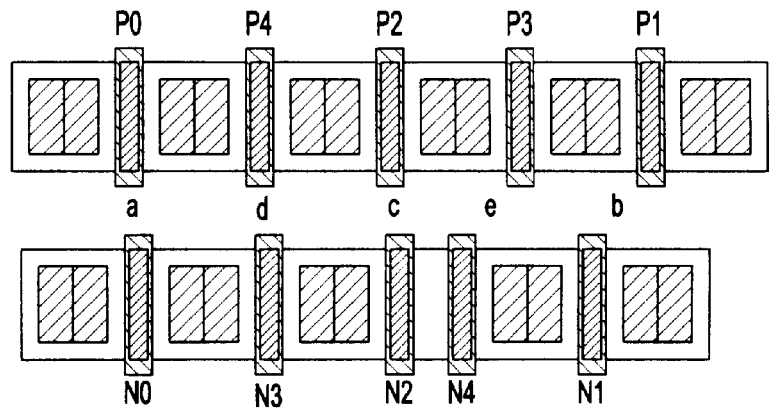
*FIG. 13k*
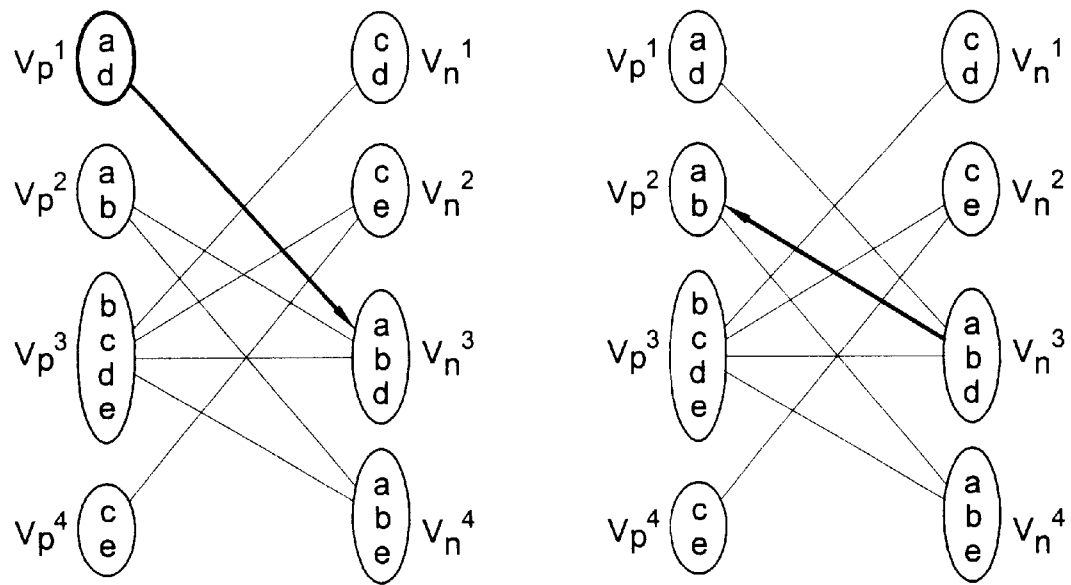
*FIG. 14a*  *FIG. 14b*

DEVICE LEVEL LAYOUT OPTIMIZATION IN ELECTRONIC DESIGN AUTOMATION

CROSS-REFERENCE TO RELATED APPLICATION

This application claims benefit of U.S. Provisional Application Ser. No. 60/185,826, filed on Feb. 29, 2000, hereby incorporated by reference as if set forth fully herein.

BACKGROUND OF THE INVENTION

1. Field of the Invention

The field of the invention generally relates to electronic design automation for integrated circuits and, more particularly, to systems and methods for optimizing the physical layout of elements in integrated circuit designs.

2. Background

Chip designers often use electronic design automation (EDA) software tools to assist in the design process, and to allow simulation of a chip design prior to prototyping or production. Chip design using EDA software tools generally involves an iterative process whereby the chip design is gradually perfected. Typically, the chip designer builds up a circuit by inputting information at a computer workstation generally having high quality graphics capability so as to display portions of the circuit design as needed. A top-down design methodology is commonly employed using hardware description languages (HDLs), such as Verilog® or VHDL, for example, by which the designer creates an integrated circuit by hierarchically defining functional components of the circuit, and then decomposing each component into smaller and smaller components.

Two of the primary types of components used in integrated circuits are datapaths and control logic. Control logic, typically random logic, is used to control the operations of datapaths. Datapath areas of the circuit perform functional operations, such as mathematical or other operations.

The various components of an integrated circuit are initially defined by their functional operations and relevant inputs and outputs. The designer may also provide basic organizational information about the placement of components in the circuit using floorplanning tools. During these design states, the designer generally structures the circuit using considerable hierarchical information, and has typically provided substantial regularity in the design.

From the HDL or other high level description, the actual logic cell implementation may be determined by logic synthesis, which converts the functional description of the circuit into a specific circuit implementation. The logic cells are then "placed" (i.e., given specific coordinate locations in the circuit layout) and "routed" (i.e., wired or connected together according to the designer's circuit definitions). The placement and routing software routines generally accept as their input a flattened netlist that has been generated by the logic synthesis process. This flattened netlist identifies the specific logic cell instances from a target standard cell library, and describes the specific cell-to-cell connectivity. By application of a physical design process, the logic cells of the netlist file are placed and routed, resulting in a layout file.

However, for some HDL modules (for example, analog modules or high performance custom digital designs), logic synthesis may be impossible because of the lack of specific logic cells in the library. In these situations, from the HDL or other high level description, the actual circuit implementation is typically determined by custom layout design, which converts a netlist associated with the circuit design into a specific circuit layout implementation. The layout modules are then placed and routed. In this situation, the placement and routing software routines generally accept as their input a flattened netlist that has been generated by the custom layout process. This flattened netlist identifies the specific layout modules from a target device library, and describes the specific device-to-device connectivity. By application of a physical design process, the layout modules created from the netlist file are placed and routed, resulting in a production-ready layout file.

Device level layout editing for custom integrated circuit block design is a time-intensive task for present-day mixed-signal circuit designs. Mixed-signal designs may include combinations of CMOS, domino MOS logic, analog, and/or other MOS topologies. Custom layout techniques make the task of device level layout editing for mixed-signal designs a major bottleneck in the entire design process, due in large part to the specialized features required to optimize the design.

One aspect of device level layout is arriving at a physical ordering of devices. The transistors of a circuit can often be ordered in different configurations without changing their logical function. Properly ordering devices in a circuit can increase the circuit's speed and reduce its layout area.

Module editing refers to a complex of layout editing and generation features that yield optimized layout for a set of devices and cells. The focus of module editing generally is device-level rather than shape-level. For MOS device level layout, module optimization methods comprise mainly device abutment and splitting. A primary optimization goal is to minimize layout area and unwanted interconnection parasitics. Minimizing area means that a maximum number of abutments should be created between the devices in the cell.

According to one well-known device layout technique, for a circuit design in which CMOS elements are present the transistors are placed in two parallel rows: the P-type transistors in one row, and the N-type transistors in another row. Power rails are routed along the two rows on the outside, and intracell routing is run between the rows. To minimize layout area, a primary goal is to place transistors in such a way that gate signals are aligned and the drain/source diffusions of adjacent transistors are abutted to the maximum extent possible, thereby reducing total diffusion area and minimizing the number of separations between diffusion strips.

While several algorithmic solutions have been proposed to optimize MOS device level layout, these solutions have limitations that restrict their utility. Prior solutions have generally been targeted toward particular circuit topologies, such as CMOS standard cells on the one hand, or specific analog circuits on the other. Furthermore, several of these solutions also suffer from inefficiencies in optimization speed.

It would therefore be advantageous to provide an improved circuit layout technique that results in rapid generation of optimal length chains and is applicable to any MOS circuit topology, including mixed-signal designs.

SUMMARY OF THE INVENTION

The present invention is directed in one or more aspects to methods for obtaining optimal layouts for integrated circuit design according to a custom physical design process.

In a first aspect of the invention, a method is provided for creating layouts characterized by optimal-length chains for different types of MOS circuit designs, including mixed-signal MOS designs. In a second separate aspect of the invention, a chaining engine having a device library and operating on a computer converts a circuit representation such as a netlist file into a layout file characterized by optimal-length chains, and such conversion may be accomplished in linear time. From a circuit representation, a bipartite graph (such as a graph having properties of an Euler graph) is prepared. A starting node in the bipartite graph is selected according to enumerated Euler trail algorithm rules. A constraint greedy walk is conducted to generate layout chains, and is preferably repeated until the bipartite graph is exhausted of edges, at which point the resulting layouts are returned. Advantageously, a single optimal layout solution can be obtained without enumerating all the possible layout options, resulting in a considerable speed advantage over conventional techniques. The disclosed chaining methods may be used, for example, in both customizing layouts and in creating automated layouts when enhanced with optional partitioning and/or folding capabilities.

In a third separate aspect of the invention, any of the foregoing aspects are contemplated in combination for additional advantage.

BRIEF DESCRIPTION OF THE DRAWINGS

FIG. 5b illustrates two possible layouts for the transistor devices depicted in FIG. 5a.

FIG. 6a is an alternate schematic of the simple CMOS circuit depicted in FIG. 5a.

FIG. 6b is a bipartite graph representation of the CMOS circuit illustrated in FIG. 6a.

FIG. 7 is a bipartite graph for a mixed-signal MOS circuit having both complementary and non-complementary portions.

FIG. 8b is a bipartite graph representation of the circuit depicted in FIG. 8a.

FIG. 8c is a possible layout for the circuit depicted in FIG. 8a.

FIG. 9b is a bipartite graph representation of the circuit of FIG. 9a.

FIG. 13k is a complete layout of the circuit depicted in FIGS. 5a and 6a obtained with the chaining method illustrated in FIGS. 10–11.

FIGS. 14a–i are bipartite graphs illustrating a first alternative application of the constraint greedy walk portion of the chaining method depicted in FIGS. 10–11 to the circuit depicted in FIGS. 5a and 6a–b.

FIGS. 15a–e and 15g–j are bipartite graphs identical to FIGS. 14a–i.

FIGS. 16b, 16c, and 16d illustrate a number of interactive chaining and folding scenarios that are presented for the circuit in FIG. 16a.

DETAILED DESCRIPTION OF PREFERRED EMBODIMENTS

Figure 1:
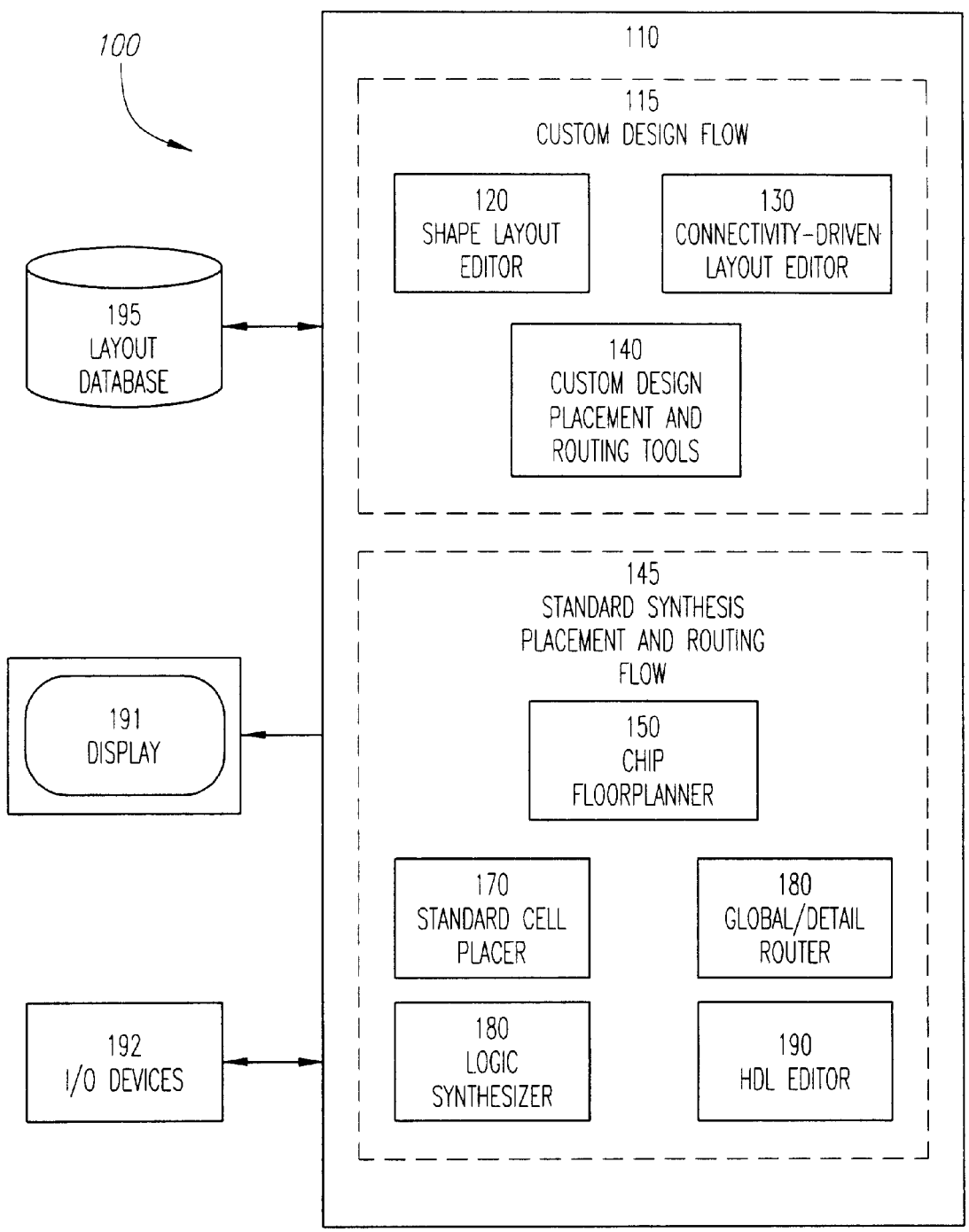
FIG. 1 is a diagram of a computer system that may be used in connection with various embodiments of the invention as described herein.

FIG. 1 is a diagram of a computer system that may be used in connection with various embodiments of the invention as described herein. As shown in FIG. 1, a computer system 100 includes a computer 110 connected to a display 191 and various input-output devices 192. The computer 110 may comprise one or more processors (not shown), as well as working memory (e.g., RAM) in an amount sufficient to satisfy the speed and processing requirements of the system. The computer 110 may comprise, for example, a SPARC™ workstation commercially available from Sun Computers, Inc. of Santa Clara, Calif., or any other suitable computer.

The computer 110 contains stored program code including, in one embodiment, a shape layout editor 120, a connectivity-driven layout editor 130, and custom design placement and routing tools 140, all as part of a custom design flow 115. The shape layout editor 120 provides for the creation of layouts at polygon level. One example of such an editor is Virtuoso® Layout Editor, commercially available from Cadence Design Systems, Inc., of San Jose, Calif. The connectivity-driven layout editor 130 in FIG. 1 provides for the construction of correct-by-construction layouts, having as input a circuit description such as a netlist. One example of this editor is Virtuoso® XL Layout Editor details of which may be found, for example, in the Virtuoso XL Layout Editor User Manual, release number 4.4.5, commercially available from Cadence Design Systems, Inc. The custom design placement and routing tools 140 perform placement and routing of custom layout modules according to specific custom constraints inferred from the circuit description or defined by the user. Commercially available examples of custom design placement and routing tools are Virtuoso® Custom Placer and Virtuoso® Custom Router, also commercially available from Cadence Design Systems, Inc. Preferably, the components of the custom design flow 115 are dynamically integrated.

In support of the above-mentioned custom design flow components, standard synthesis, placement, and routing flow tools 145 may be usefully employed. Such tools 145 may include a chip floorplanner 150, global/detail router 160, standard cell placer 170, logic synthesizer 180, and HDL editor 190. Operation of the chip floorplanner 150, global/detail router 160, standard cell placer 170, logic synthesizer 180, and HDL editor 190 is conventional, as the design of these components is well known in the art of electronic design automation. Commercially available examples of these system components are Preview™, Cell3™, QPlace™, Synergy™, and Verilog®, respectively.

The computer 110 is preferably coupled to a mass storage device (e.g., magnetic disk or cartridge storage) providing a layout database 195 with which the foregoing system components interface. The layout database 195 may be implemented using the EDIF database standard. The computer 110 may also comprise or be connected to mass storage containing one or more component libraries (not shown) specifying features of electrical components available for use in circuit designs.

Figure 2:
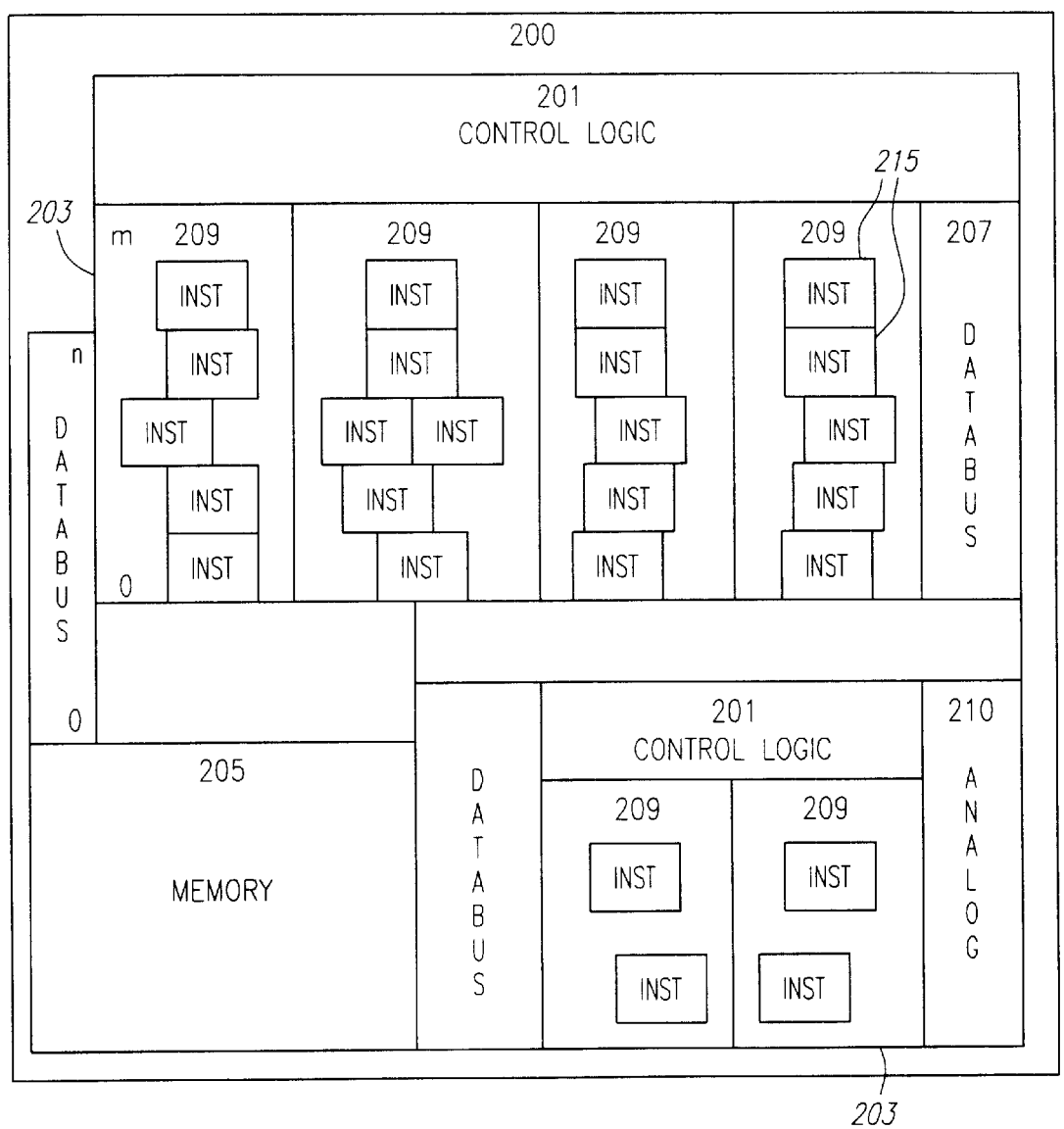
FIG. 2 is a diagram of a simplified integrated circuit as may be generated using a computer system such as shown in FIG. 1 or according to the process set forth in FIG. 3.

Referring now to FIG. 2, there is shown an illustration of a simplified integrated circuit 200 that may be represented by circuit design data stored in the layout database 195. In actual, more realistic integrated circuit designs, the integrated circuit 200 would be far more complicated. However, FIG. 2 is useful for purposes of illustration. As shown therein, the integrated circuit 200 comprises of a plurality of control regions 201, datapath regions 203, and memory 205. The various control regions 201, datapath regions 203 and memory 205 are interconnected with databuses 207 generally spanning multiple bits. Each datapath region 203 may comprise a plurality of datapath functions 209. A datapath function 209 may utilize some or all of the bits available from the databus 207. A datapath function 209 may comprise a plurality of cell instances 215 which enable some form of signal or logic transformation of the data passed by the databus 207. The cell instance 215 within a datapath function 209 generally operates on the data carried on the datapath function 209. Custom layout design generally applies to control logic 201, memory 205, databus 207, and analog block 210, for which specific instances do not exist in the library and custom device-level layouts must be created.

As represented in the schema of the layout database 195, the integrated circuit 200 is comprised of a plurality of instances and a plurality of nets. A net interconnects a number of instances, by associating pins on each of the instances or, more generally, by associating the inputs and outputs of a number of instances.

Figure 3:
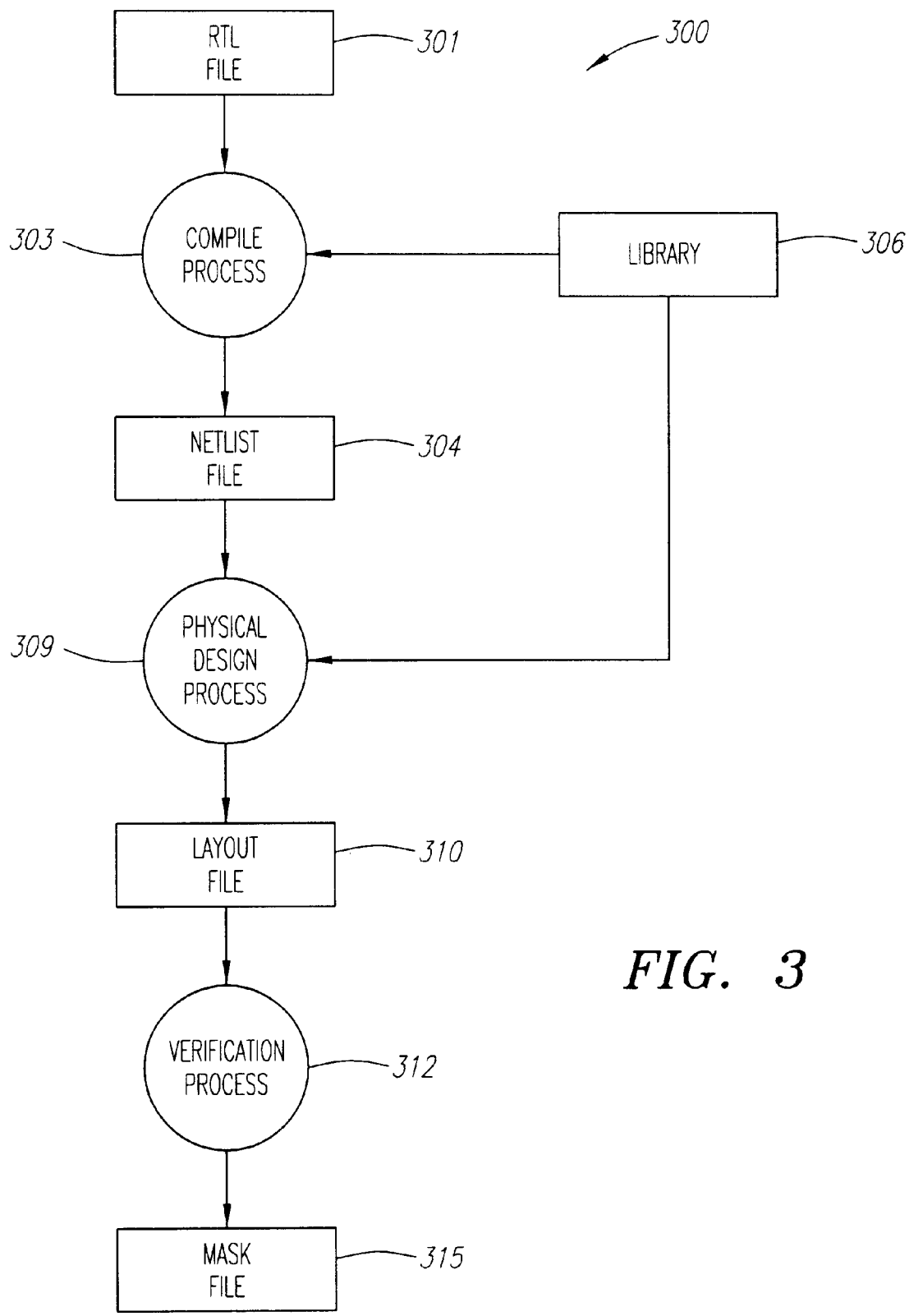
FIG. 3 is a diagram of a general process flow for a circuit design, illustrating various levels of circuit abstraction.

FIG. 3 is a diagram of a general process flow for a circuit design, illustrating some of the various levels of circuit abstraction as described above. As illustrated in FIG. 3, a register transfer logic (RTL) file 301 in the form of an HDL file or other high level functional description undergoes a compile process 303, which typically includes some form of logic synthesis, and converts the functional description of the circuit into a specific circuit implementation which may be stored in the form of a netlist file 304. As part of the compile process 303, a component and device library 306 is generally referenced, which stores information concerning what types of design components and devices are available, and the characteristics of those design components and devices which are needed in order to determine their functional connectivity. For custom design, the netlist file 304, as previously noted, generally identifies the specific devices from a device-level library, and describes the specific device-to-device connectivity.

By application of a custom physical design process 309 shown in FIG. 3, the devices of the netlist file 304 are instantiated, layout modules are generated, and these modules are then placed and routed, resulting in a layout file 310. The device library 306 is utilized in this process stage in order to obtain information concerning the sizes of the devices and other components that may be present in the netlist file 304.

From the layout file 310, a verification process 312 may be run, as further illustrated in FIG. 3, resulting in a mask file 315 in, for example, a GDSII or CIF format. The mask file 315 may be provided to a foundry, and contains enough information to allow the foundry to manufacture an actual integrated circuit therefrom.

Figure 4:
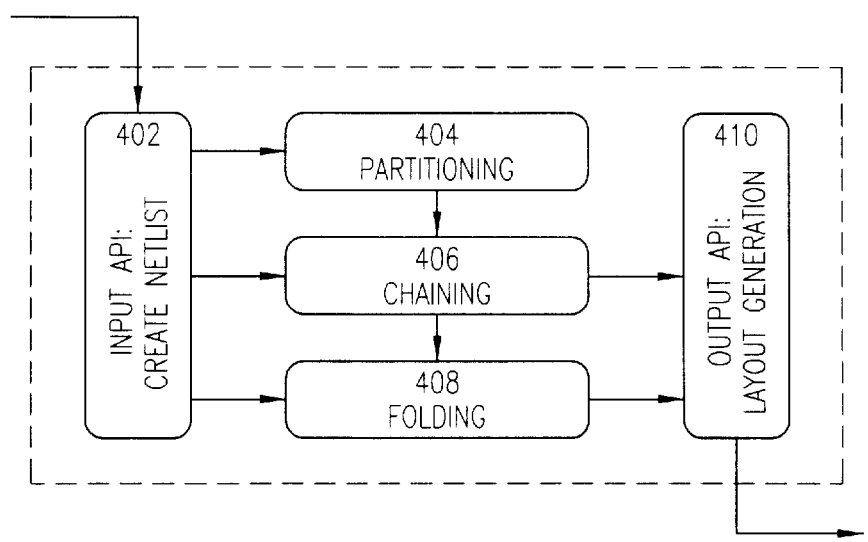
FIG. 4 is a process flow diagram for custom physical design of an integrated circuit.

Various embodiments as described herein relate to the physical design process 309 depicted in FIG. 3, and more specifically to the task of device level layout optimization to arrive at a particular layout. In accordance with a preferred embodiment as disclosed herein, an automated custom physical design (APCD) flow is used to facilitate the rapid design of custom layout blocks. FIG. 4 depicts a basic strategy for a custom physical module generation process 400. As illustrated in FIG. 4, an input application procedural interface (API) 402 provides a circuit representation, such as a netlist file, to a chaining engine 406. Chaining in that context generally refers to the process of linking circuit elements according to instructions in a circuit representation. The output of a chaining engine 406 is provided to an output API 410, typically resulting in a layout file. Preferably, the custom physical module generation process 400 is augmented with additional steps, such as a partitioning step 404 and a folding step 408. The partitioning step 404 involves data preparation that reduces the size of the input to the chaining engine 406. Partitioning is typically performed based on the original circuit hierarchy and user specifications. A reduced input size, having fewer elements, ensures that shorter and more placement-useful chains will be obtained. The folding step 408 preferably involves data finishing performed after chaining is complete; more specifically, folding splits a chained circuit into multiple parallel devices to address user-defined width constraints. The physical design strategy depicted in FIG. 4 is utilized, for example, in the Virtuoso® XL Layout Editor referred to previously.

Figure 5B:
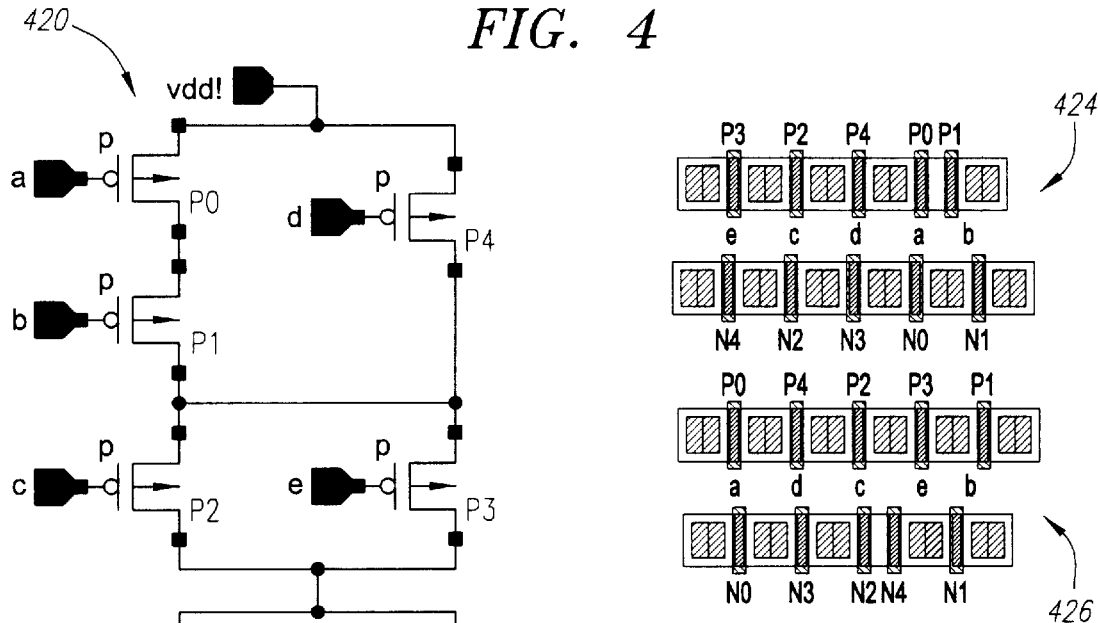
Figure 5A:
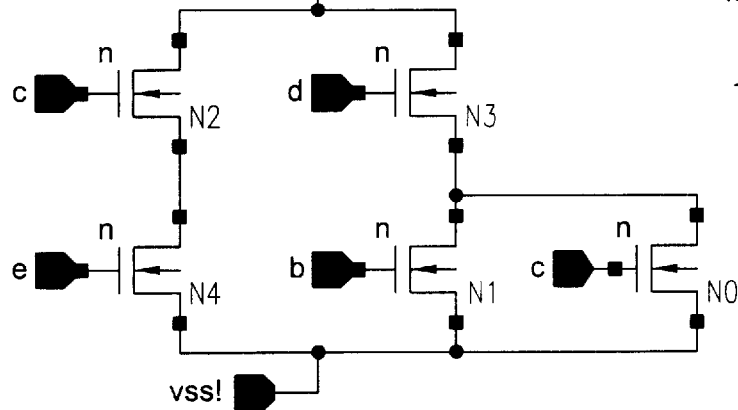
FIG. 5a is a schematic of a simple CMOS circuit.

The process illustrated in FIG. 4 preferably arrives at an optimal layout, having a minimal area and short wire lengths. Arriving at an optimal layout can be quite challenging. Even a simple circuit design typically can be implemented in a multiplicity of possible layouts. For example, FIG. 5a depicts a simple CMOS cell schematic 420, while FIG. 5b depicts two possible layouts 424, 426 in which the schematic 420 can be implemented. As circuit complexity and the number of circuit elements increases, the number of possible layouts grows dramatically.

One way of modeling the possible abutments between transistors in a circuit is through a bipartite graph. A bipartite graph may be used as a modeling tool in creating a layout, such as the layouts depicted in FIG. 5b. For example, FIG. 6a provides a schematic for a simple CMOS circuit 440 including multiple transistors, and FIG. 6b provides its bipartite graph representation. A bipartite graph in one aspect represents the possible abutments between pairs of transistors. Each node in the bipartite graph 442 corresponds to a set of pairwise abuttable P-type or N-type transistors, that is, transistors sharing the same P-type or N-type drain/source diffusion net (connection) in the circuit 440. In the graph 442, the "left" nodes 444 correspond to the nets to which PMOS transistors are connected with either the source and drain terminal. Similarly, the "right" nodes 446 correspond to the NMOS transistors. The edges 448 correspond to a set of NMOS and PMOS pairs that share the same gate connection and the same pair of nodes. An edge exists between two nodes if and only if an abutment is possible between two pairs which are composed of the transistors represented by these two nodes. A bipartite edge corresponds to a pair of transistors with a common gate connection that can abut on the nets corresponding to the nodes it connects. A bipartite edge in this context always connects a "right" node to a "left" node. In FIG. 6*b*, all of the edges 448 shown are bipartite edges.

FIG. 7 depicts an exemplary bipartite graph 50 for a mixed-signal MOS circuit, illustrating the presence of both complementary and non-complementary portions. Nodes 1–8 correspond to the complementary portion of the circuit, and include bipartite edges 1.7, 2.5, 2.6, 3.8, and 4.6. The graph 50 further nodes 9–12 that correspond to a non-complementary portion of the circuit, which portion is characterized by non-bipartite edges 4.9, 10.11, and 8.12. A non-bipartite edge corresponds to a transistor that does not have a complementary pair. Generally, a non-bipartite edge always connects nodes on the same side of a bipartite graph. The degree of a node reflects the number of bipartite edges corresponding to that node. For example, node 1 has only one corresponding bipartite edge 1.7, and therefore has a degree of one, whereas node 2 has two corresponding bipartite edges 2.5 and 2.6, and therefore has a degree of two. A node with an odd number of corresponding bipartite edges is said to have an odd degree, while a node with an even number of corresponding bipartite edges is said to have an even degree. Therefore, the terms "odd" and "even" as used herein in connection with nodes apply only to the number of bipartite edges corresponding to a node. A node having only non-bipartite edges would not be characterized as having a degree, whether odd or even.

Figure 8A:
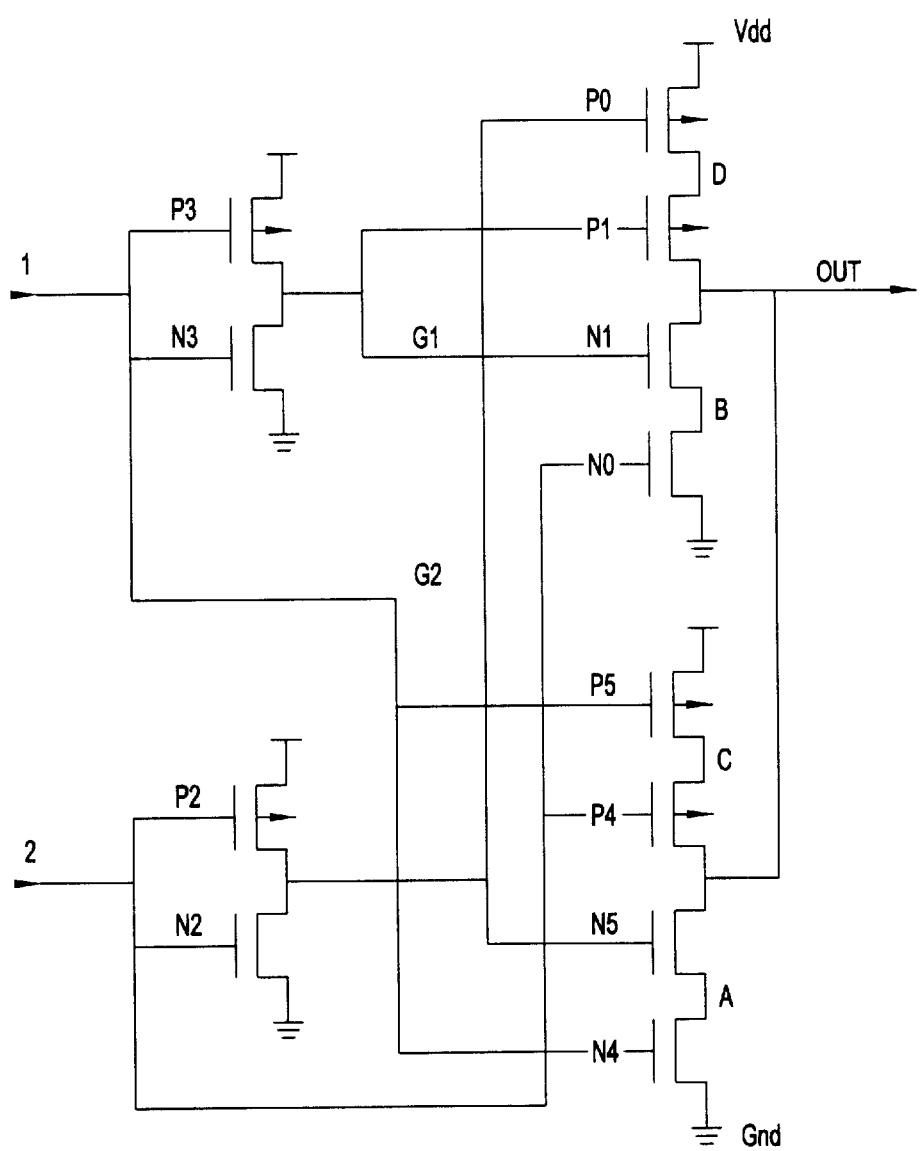
FIG. 8a is a netlist of a second CMOS circuit.
Figure 8B:
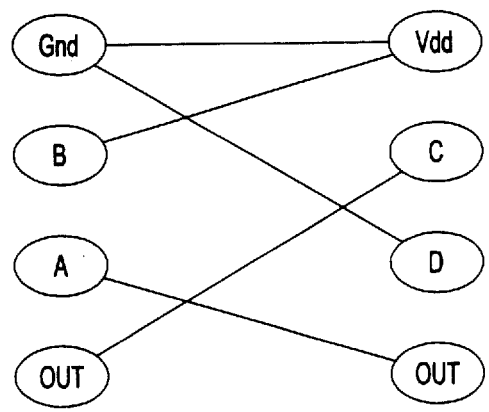
Figure 8C:
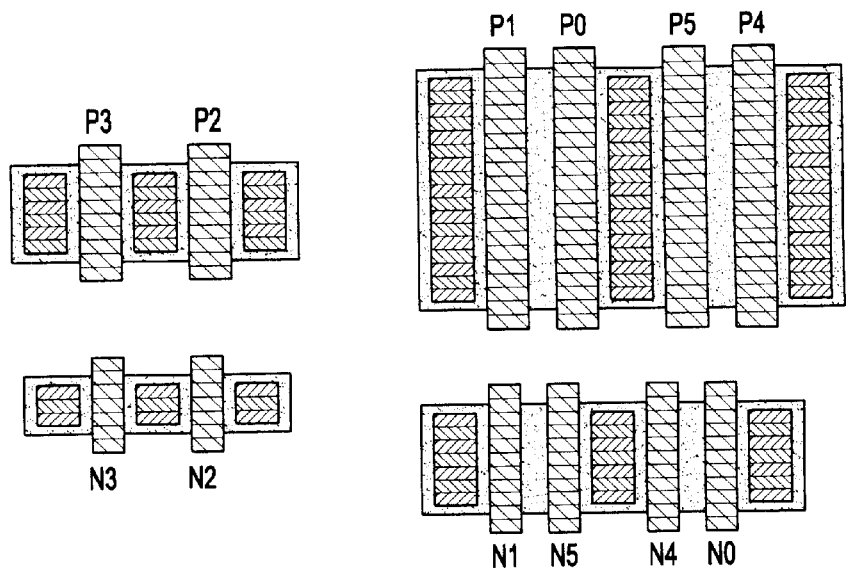

A further example showing a bipartite graph in context as a layout tool is provided in FIGS. 8*a*–8*c*. FIG. 8*a* illustrates a CMOS circuit and information relating to its netlist representation; FIG. 8*b* shows a bipartite graph structure of that circuit; and FIG. 8*c* illustrates a resulting layout. In FIGS. 8*a*–8*c*, left node labeled "out" has the NMOS devices N1 and N5 connected, and right net labeled "C" has the PMOS devices P0 and P1 connected. An edge exists between "out" and "C" because net "G1" and "G2" connect the pairs (N1, PI) and (N5, P0) respectively. The edge completes the abutments N1, N5 and P1, P0 on the nets "out" and "C" respectively, with the gate connections G1 and G2 aligned.

Since it represents all possible abutments between pairs of transistors in a circuit, a bipartite graph typically has redundant information. A concept called mutual exclusivity assists in discovering redundant information, and permitting a greedy walk (discussed below) to continue through only one of the redundant paths. A bipartite graph may include "mutually exclusive edges" and "essential edges." Two possible abutments are referred to as "mutually exclusive" if at most one of them can be in any solution. Otherwise, they are referred to as "compatible." In the bipartite graph, two edges that represent two mutually exclusive possible abutments, respectively, are "mutually exclusive edges."

Restated, two edges that represent to a connection between nodes i and j, and respectively nodes i' and j', corresponding to transistor gates k l, and respectively transistor gates k' l', are mutually exclusive if either the first or second gate connections denoted by k l, k' l' and the nodes to which these edges are connected are not common at either end. In FIG. 6*b*, wherein each node 448 is labeled with a letter "e" followed by subscripts and superscripts, the subscripts refer to the nodes (denoted as i, j or i', j' above) and the superscripts refer to the transistor gates (denoted as k l or k'l' above).

An "essential" abutment is an abutment that must appear in any solution derived from the current node. In the bipartite graph, an edge that represents an essential abutment is an "essential edge." In other words, an "essential edge" is an edge that must appear in any solution.

Figure 9A:
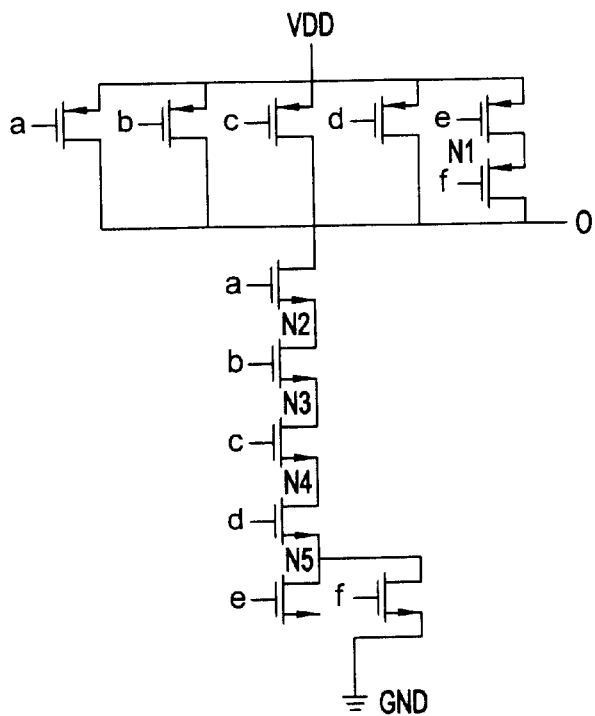
FIG. 9a is a circuit diagram.
Figure 9B:
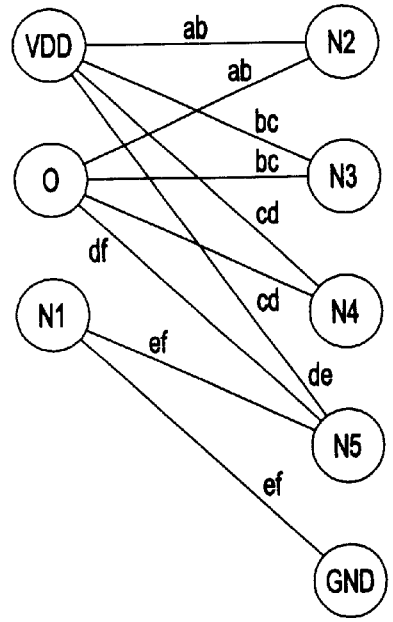

To further illustrate the concepts of essential and mutually exclusive edges, attention is directed to FIGS. 9*a* and 9*b*. FIG. 9*a* is a circuit diagram with labeled nodes. In FIG. 9*a*, the abutment between the N5 transistors e and f is through the GND connection in any optimal solution. For this reason, the node GND and the node N1, and the edge connecting them, are essential in any optimal solution. FIG. 9*b* is a bipartite graph for the circuit provided in FIG. 9*a*. The letters accompanying each edge refer to the transistor gates in FIG. 9*a* (denoted as k l or k'l' above, or as superscripts in FIG. 6*b*). To avoid cluttering the illustration, the edges do not include separate labels referring the nodes (denoted as i, j or i', j' above, or as subscripts in FIG. 6*b*); however, as each node is labeled separately, the starting and ending nodes for each edge is evident.

With regard to mutual exclusivity, FIG. 9*b* has five sets of mutually exclusive edges: (1) edge ab between nodes VDD and N2, and edge ab between nodes N2 and O; (2) edge bc between nodes VDD and N3, and edge bc between N3 and O; (3) edge cd between nodes VDD and N4, and edge cd between nodes N4 and O; (4) edge de between nodes VDD and N5, and edge df between nodes N5 and O; and (5) edge ef between nodes N5 and N1, and edge ef between nodes N1 and GND. Since edge ef connecting nodes N1 and GND was identified as an essential edge which must be included in any optimal solution, the edge ef connecting nodes N1 and N5 cannot be included in an optimal solution since it is in a mutually exclusive set with the edge ef connecting nodes N1 and GND.

Figure 10:
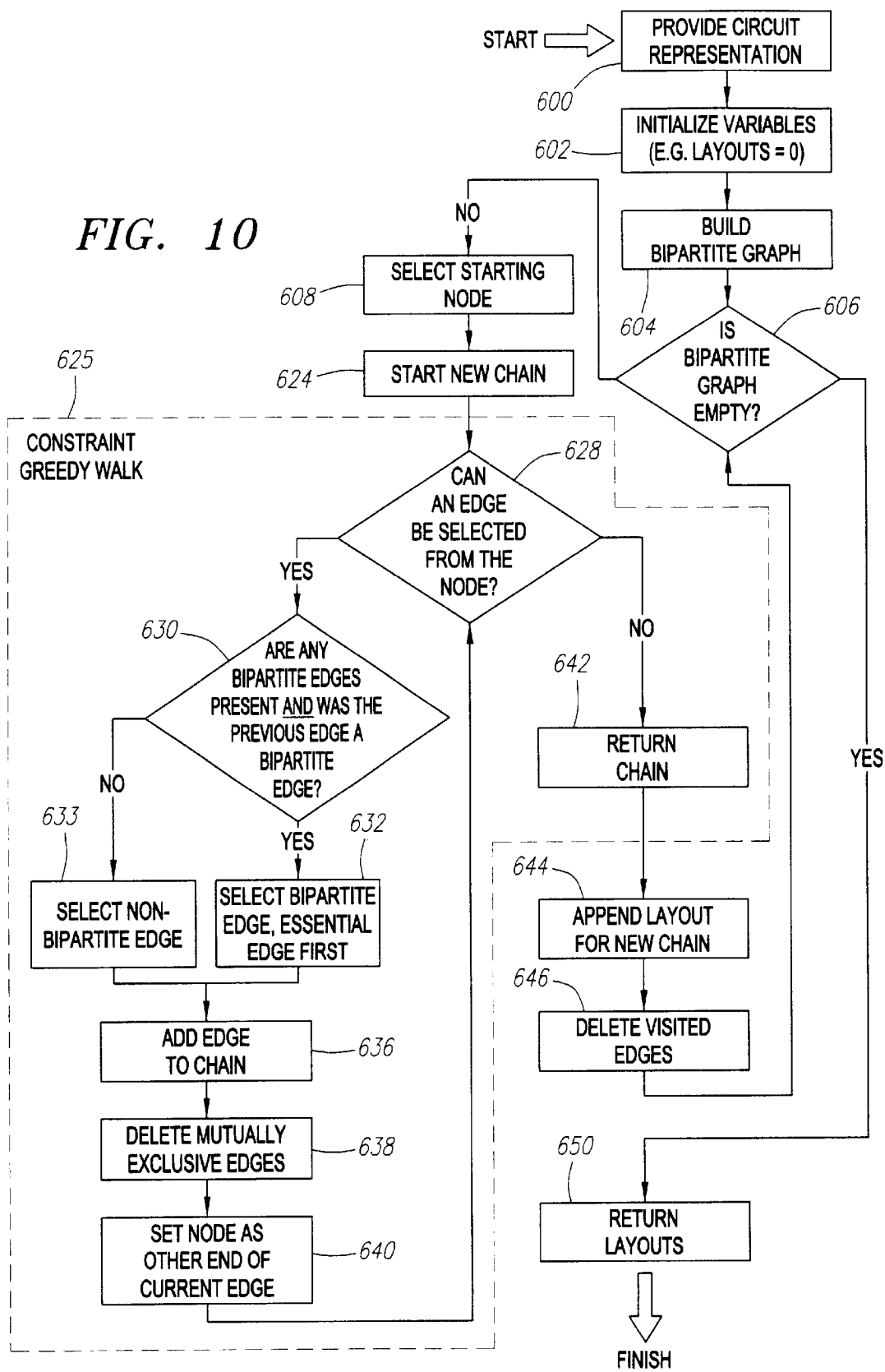
FIG. 10 is a flow diagram for a method for creating layouts for MOS circuit designs, including mixed-signal MOS designs, characterized by optimal-length chains.

Having introduced the bipartite graph model, focus will now be directed on the chaining step of the physical layout process, deferring a more detailed discussion of optionally associated partitioning and folding steps until later. A method for creating layouts characterized by optimal-length chains for any type of MOS circuit designs, including mixed-signal MOS designs, is provided in FIG. 10. Preferably, the method depicted in FIG. 10 is embedded in a software routine that may be operated on a computer system, such as the computer system 100 depicted in FIG. 1. A first step 600 in the method is providing a circuit representation, which may be a netlist or other representation, as an input. Initialization of variables, such as layout number, is a following step 602. A next step 604 is building a bipartite graph (a simple example of which is shown in FIG. 6*b*) from the circuit representation provided as an input. The bipartite graph identifies complementary portions of a circuit, irrespective of its size and topology. When preparing the bipartite graph, "essential edges" and "mutually exclusive edges" should be identified, as this identification information will be considered in a subsequent step. This identification may be performed by computation, and is automated. One method of implementing this identification is to annotate the bipartite graph with the presence of essential and mutually exclusive edges. The next step 606 involves examination of the bipartite graph to determine whether it contains any edges.

Figure 11:
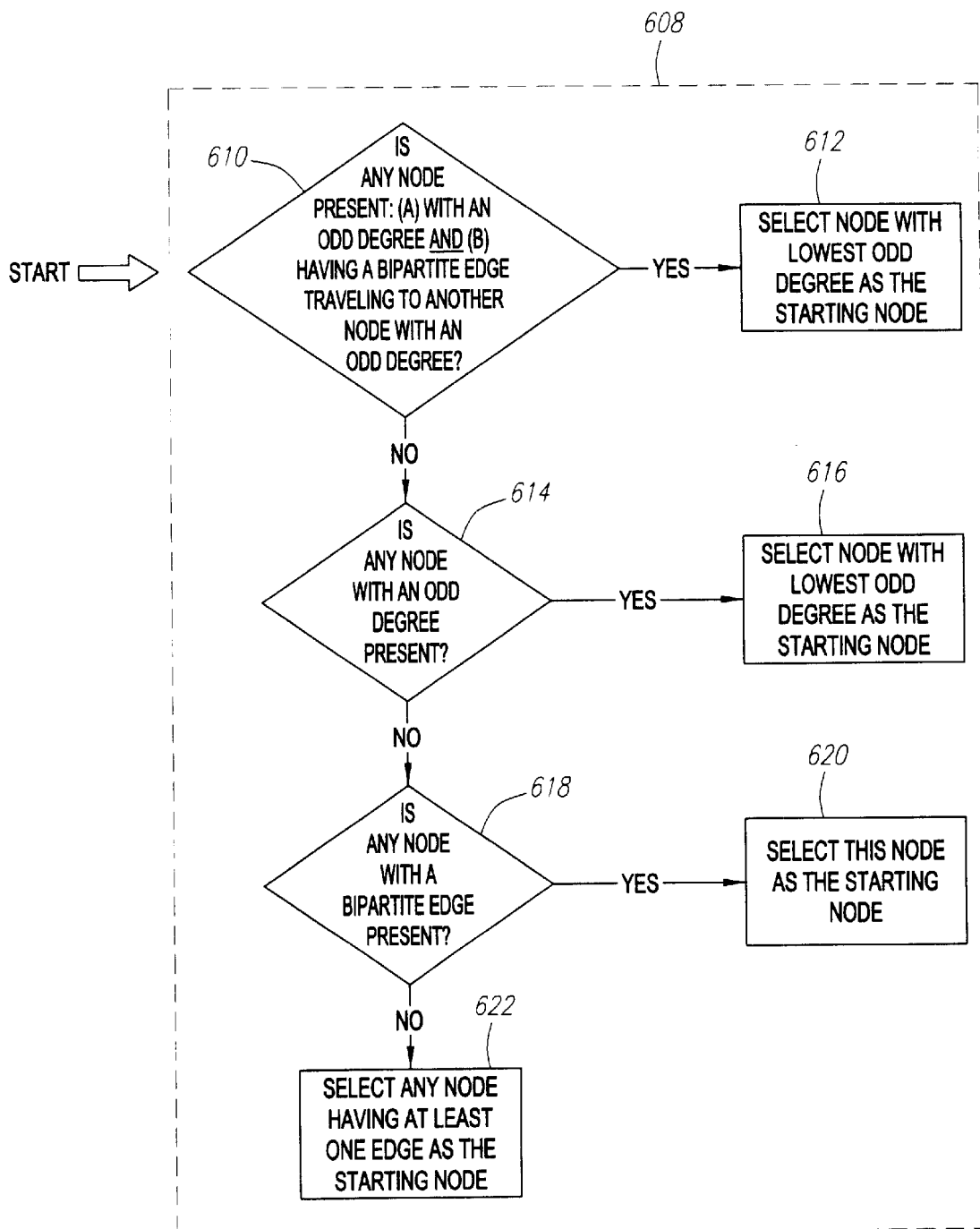
FIG. 11 is a flow diagram for the step of selecting a starting node depicted in FIG. 10.

So long as the bipartite graph is not empty, the method proceeds to the step of selecting a starting node 608 for initiating a constraint greedy walk 625 to generate a chain. Attention is directed to FIG. 11 for further details on the step of selecting a starting node 608. The bipartite graph preferably has the same properties as an Euler graph; an optimal length walk thus preferably starts according to the following Euler trial algorithm rules, applied in descending order:

(a) According to a first decision block 610, if there is present in the bipartite graph a node with an odd degree, which node also has a bipartite edge traveling to another node of odd degree, then such node with the lowest odd degree is selected as the starting node for the greedy walk, consistent with block 612.

(b) If the first condition is not satisfied, then according to a second decision block 614, if there is present in the bipartite graph any node with an odd degree, then such node with the lowest odd degree is selected as the starting node for the greedy walk consistent with block 616. Inherently from the Euler trail properties, this implies that the entire greedy walk will end at a node with an odd degree (c) If neither of the first two conditions are satisfied, then according to a third decision block 618, the greedy walk may start at any other node having a bipartite edge, consistent with block 620.

(d) If none of the first three are satisfied (i.e., no nodes having bipartite edges are present), then the greedy walk may start at any node having at least one edge connected to it, consistent with block 622.

The starting node obtained according to these rules generally guarantees finding an optimal solution.

Referring back to FIG. 10, each greedy walk is preferably performed after creation of a new chain 624. The constraint greedy walk 625 may involve several sub-steps. According to one embodiment, a first sub-step 628 is determining whether an edge can be selected from the starting node. If the answer is affirmative and an edge can be selected, then a second inquiry 630 is performed to determine whether any bipartite edges are present in the bipartite graph 604. If any bipartite edges are present, then a bipartite edge is selected to continue the walk, selecting an essential edge first in preference, according to sub-step 632. Only if no bipartite edges are present will a non-bipartite edge be selected to continue the walk, and the walk will proceed thereafter only with non-bipartite edge until none are available, according to substep 633. Thereafter, the selected edge is added to the chain 624 in sub-step 636. Following addition of the edge to the chain is, at substep 638, deletion from the bipartite graph 604 of any edges mutually exclusive to the edge just selected. As noted above, mutual exclusivity identifies redundant sets of edges, and such sets were identified previously when the bipartite graph was generated. Yet it is not until one edge of a mutually exclusive set is selected that the other edges in that set will be subject to deletion, for it is not until one edge is selected that the unnecessary edges are known. Deletion of the remaining edges in a mutually exclusive set permits the greedy walk to continue through only one of the redundant paths.

The next sub-step 640 is setting the node as the other end of the current edge. The method then returns to the inquiry at sub-step 638, and the chain continues to grow in like fashion until no further edges can be selected from the node. At that point, the completed chain is returned from the greedy walk 625 at sub-step 642.

Following the constraint greedy walk 625 is creation of a layout 644 using devices from the reference library 306, depicted in FIG. 3, for the new chain 624. Each layout 644 is stored in a memory, such as is present in the computer system 100 depicted in FIG. 1. Continuing to refer to FIG. 10, the next step 646 is deletion of the edges visited during the constraint greedy walk 625. These steps 608–646 continue until the bipartite graph 604 is emptied of edges, at which point the resulting layouts 650 are returned.

The constraint greedy walk is a modified Euler walk that yields chains for the NMOS and PMOS devices simultaneously. The complexity of the overall method is $\theta(n \times s)$, where n is the number of nets and s is the number of terminals per nets. For real-life circuits, the number of nets is proportional with the number of devices and the number of terminals per net is limited, hence the algorithm complexity for the present method is linear with the size of the circuit. Also, the bipartite graph of any MOS circuit can be constructed in linear time.

A chaining method in accordance with the general principle of the technique illustrated in FIGS. 10–11 may be restated in more generalized language, as follows. First the complementary portion of the circuit is identified, irrespective of size and topology, in a bipartite graph. Next, a single optimal solution for any complementary MOS sub-circuit is obtained, as a pair of NMOS and PMOS chains, utilizing a constraint greedy walk through the bipartite graph. In other words, the greedy walk step starts with the assumption that the circuit design includes CMOS elements. The greedy walk processes each complementary pair until none are left in the bipartite graph. When one walk is completed, that is, a NMOS and PMOS pair of chains is found, another walk is attempted for the remaining edges in the graph. Since each edge is visited only once, after all complementary pairs have been exhausted, then a simpler walk may be continued to process the remaining edges. The chaining method also yields placement constraints such as alignment and orientation. That is, the devices in the same chain are aligned along the abutment direction. Also, the chain pair is aligned such that the device gates are in vertical alignment. The solution obtained is optimal with respect to the number of abutments created per circuit and the number of gate alignments.

Figure 12A:
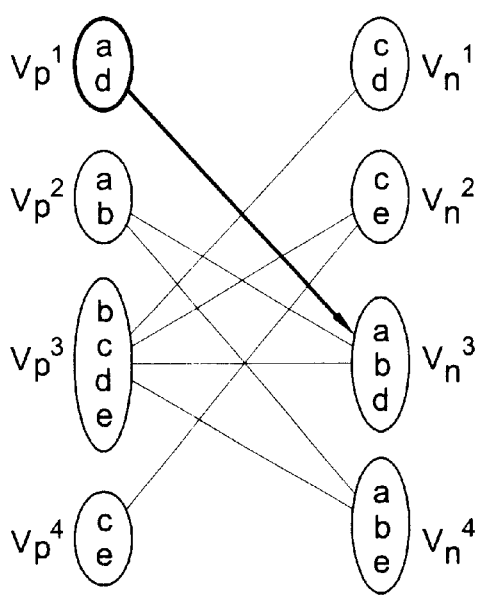
FIGS. 12a–i are bipartite graphs illustrating an application of the constraint greedy walk portion of the chaining method depicted in FIGS. 10–11 to the circuit depicted in FIGS. 5a and 6a–b.

FIGS. 12a–i and 13a–k illustrate an application of a preferred constraint greedy walk portion of the chaining method described in connection with FIGS. 10–11 to the circuit depicted in FIGS. 5a and 6a–b. FIG. 12a provides a bipartite graph illustrating the selection of the starting node $v_p^1$ according to step 608 of FIGS. 10–11, and further illustrates selection of a first edge (bolded) according to steps 628–633. The first edge if added to the chain according to step 636, and as there are no edges mutually exclusive with the first edge just selected, node $v_n^2$ is set as the current edge according to step 640.

Figure 12B:
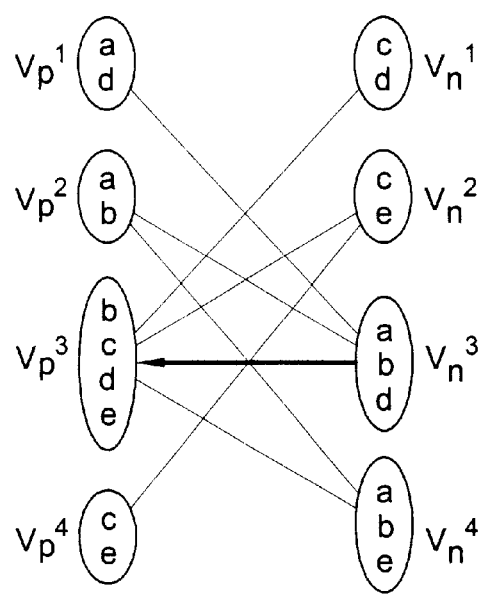
Figure 12C:
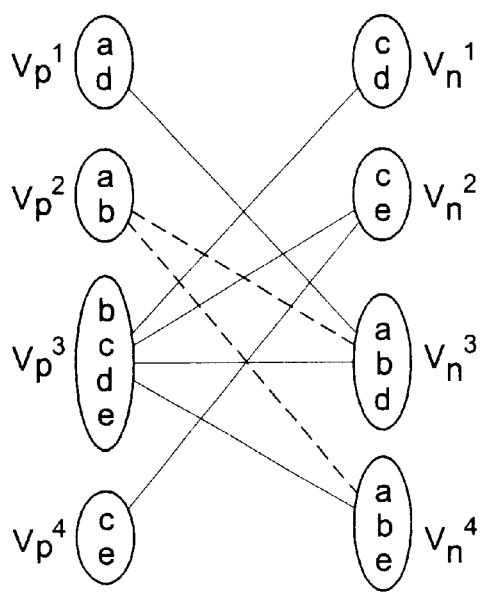
Figure 12D:
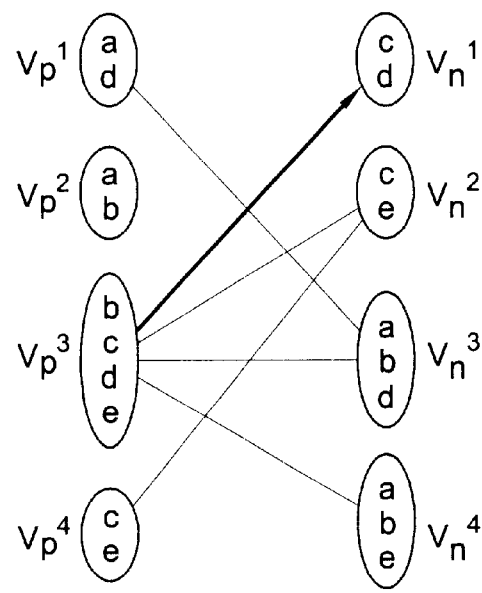
Figure 12E:
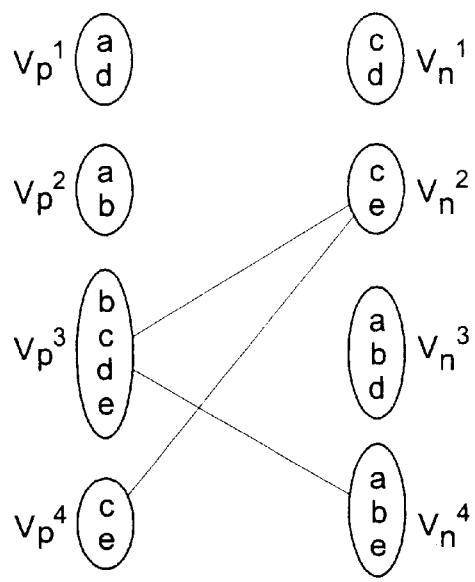
Figure 12F:
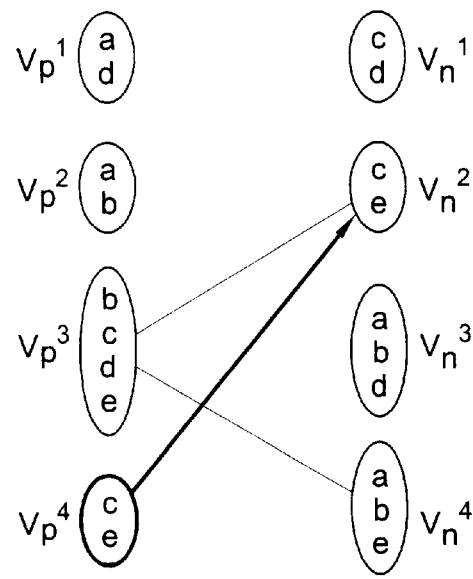
Figure 12G:
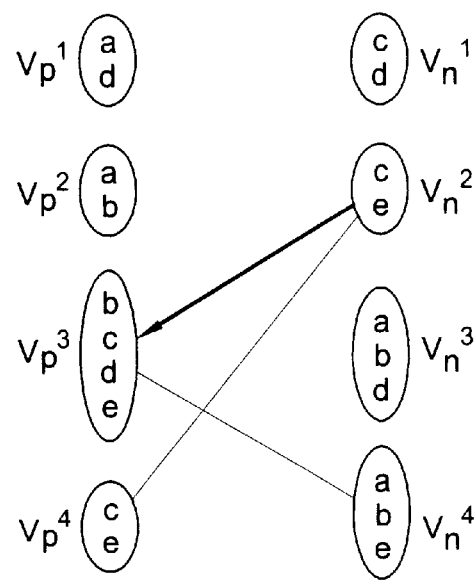
Figure 12H:
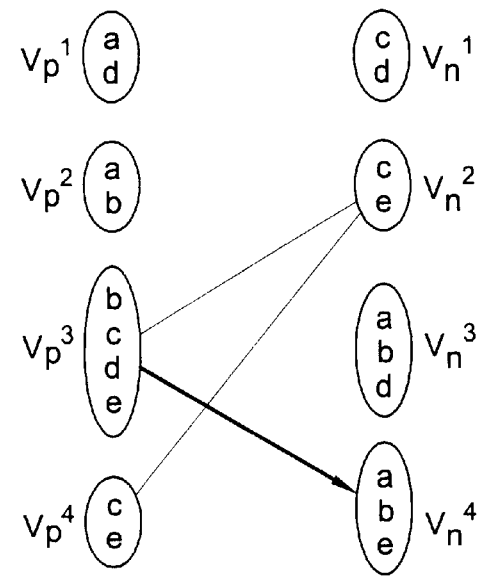
Figure 12I:
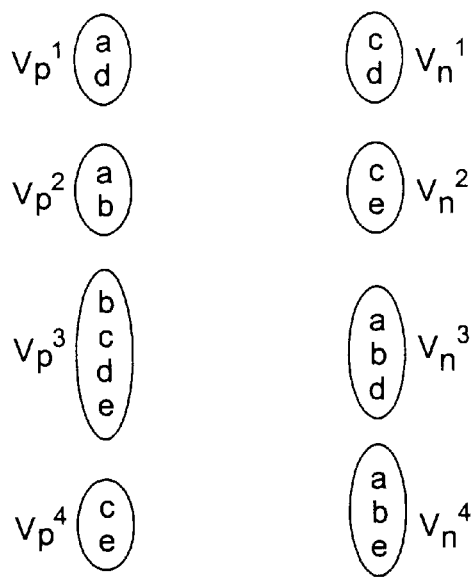

FIG. 12b illustrates the selection of a second edge (bolded) according to the constraint greedy walk in step 628. The second edge is then added to the chain. FIG. 12c illustrates the deletion of edges mutually exclusive to the second edge, with the deleted edges shown in bold dashed lines, according to step 638. FIG. 12d illustrates the selection of a third edge (bolded) according to the constraint greedy walk. Since no further edges can be selected from the node $v_n^1$, the chain is returned and appended to the layout according to steps 642–644, and the visited edges are deleted in FIG. 12e according to step 646. Thereafter, a new starting node and first edge are selected in FIG. 12f, then a second edge is selected in FIG. 12g, and a third edge is selected in FIG. 12h. Since no further edges can be selected from the node $v_n^4$, the chain is returned and appended to the layout. The visited edges are deleted in FIG. 14i, and, since there exist no further edges in the bipartite graph, the layouts are returned at step 650.

Figure 13A:
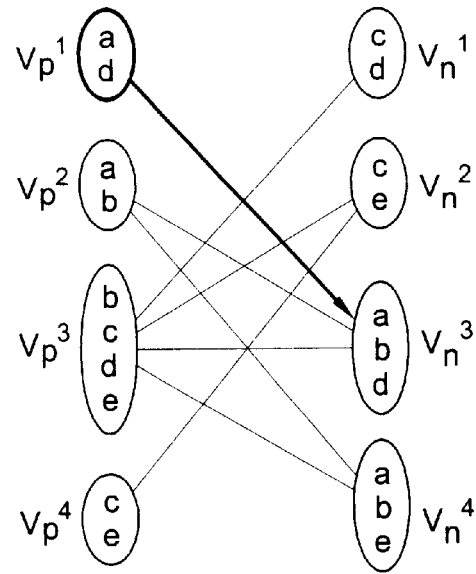
FIGS. 13a–e and 13g–j are bipartite graphs identical to FIGS. 12a–i.
Figure 13B:
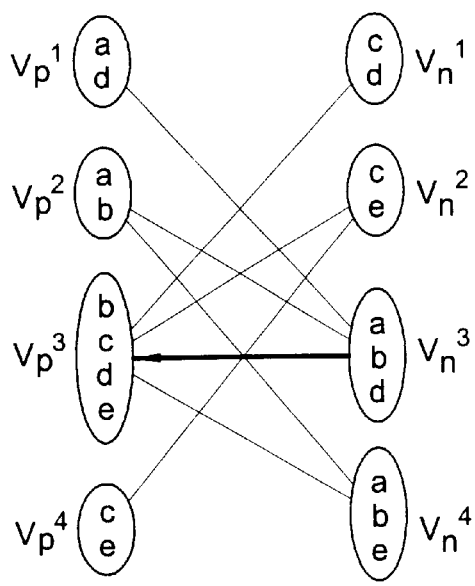
Figure 13C:
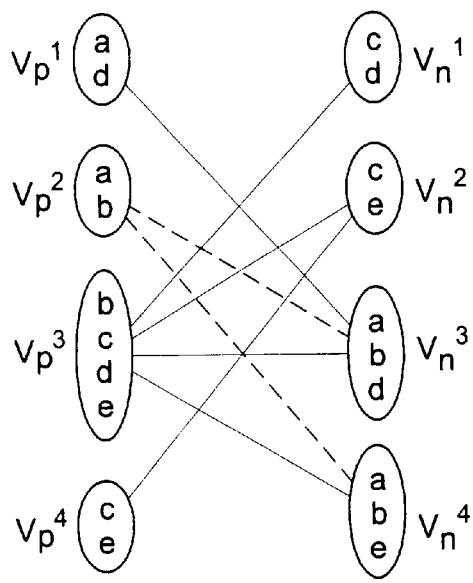
Figure 13D:
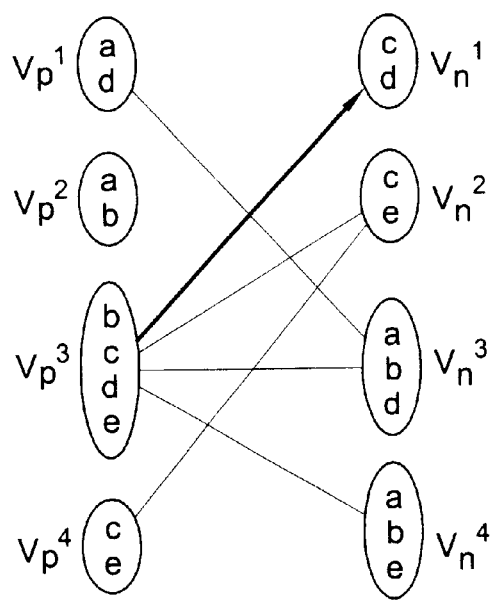
Figure 13E:
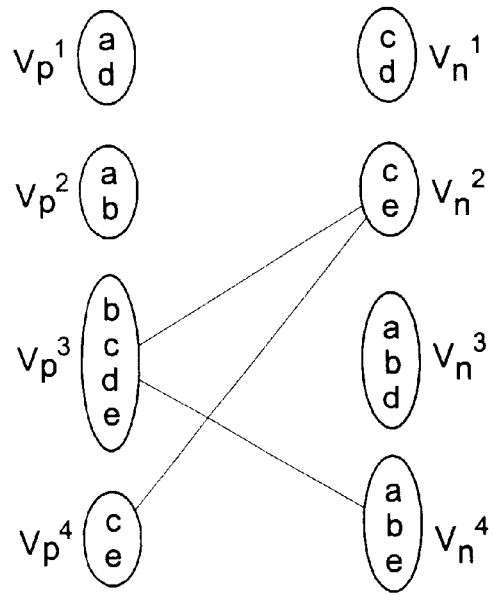
Figure 13F:
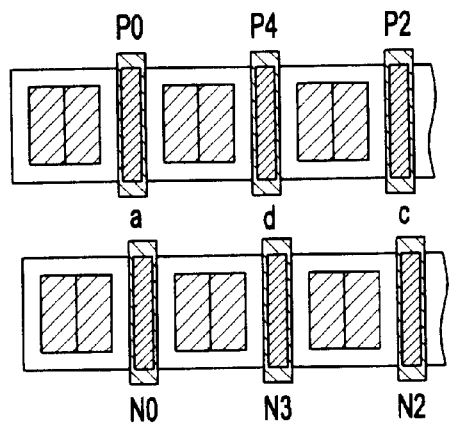
FIG. 13f is a partial layout of the circuit depicted in FIGS. 5a and 6a obtained with the chaining method illustrated in FIGS. 10–11.
Figure 13G:
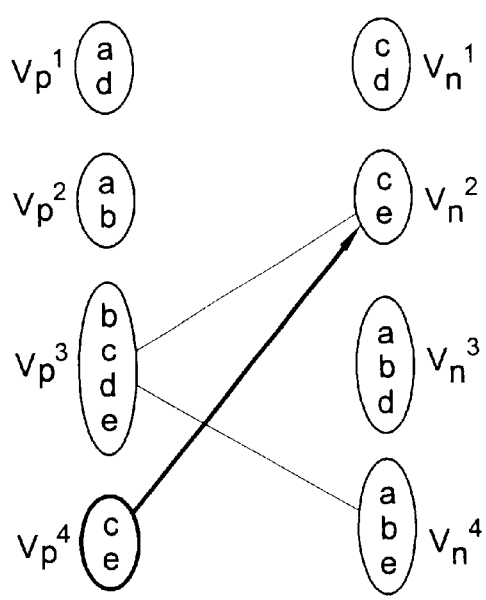
Figure 13H:
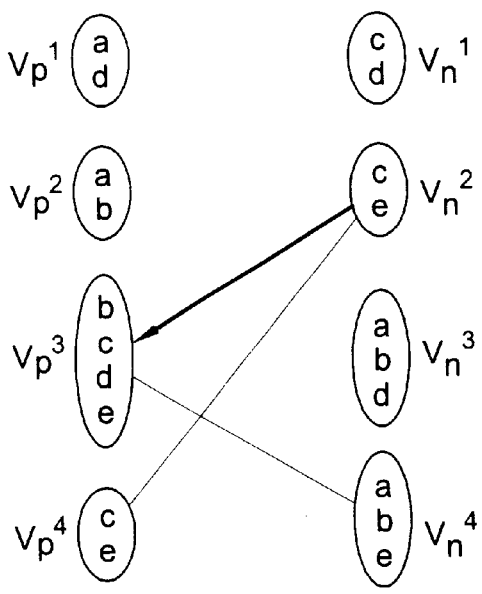
Figure 13I:
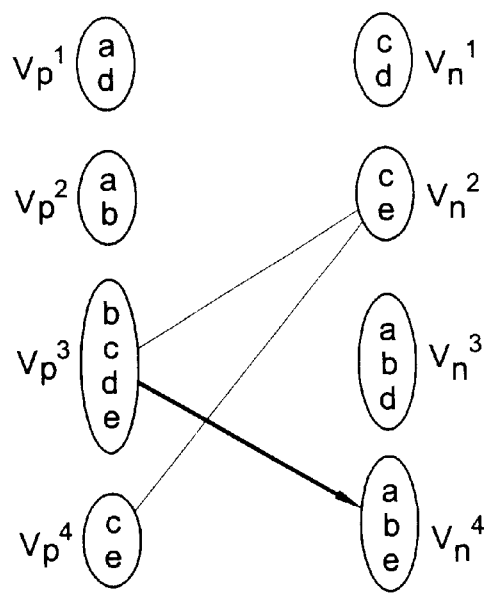
Figure 13J:
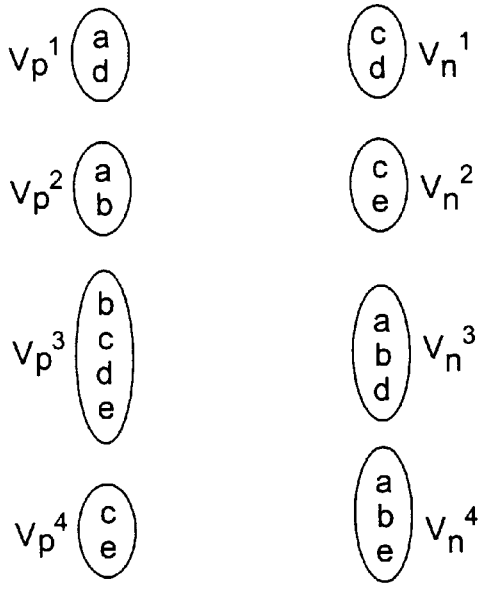

FIGS. 13a–e are duplicative of FIGS. 12a–e, but FIG. 13f illustrates the point at which a layout is obtained and what the layout looks like. Note that the layout of FIG. 13f constitutes a portion of layout 426 of FIG. 5b. Thereafter, FIGS. 13g–j are duplicative of FIGS. 12f–i, but FIG. 13k illustrates what point at which an appended layout is obtained and what the final layout looks like. Note that the layout of FIG. 13k is the same as the layout 426 of FIG. 5b.

Figure 14C:
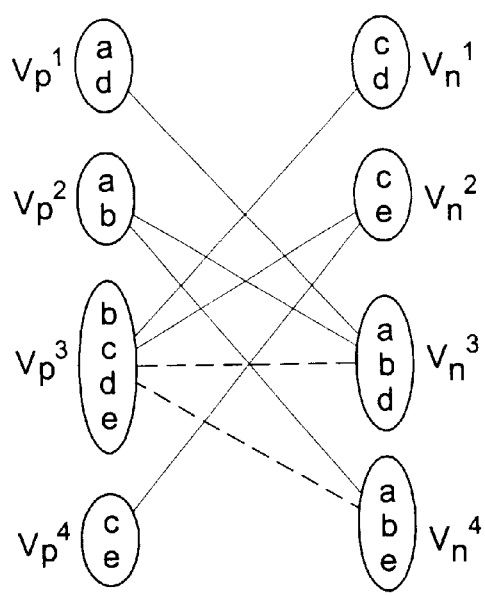
Figure 14D:
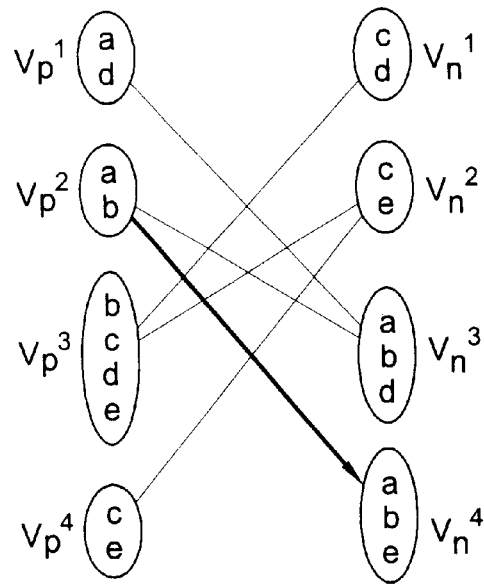
Figure 14E:
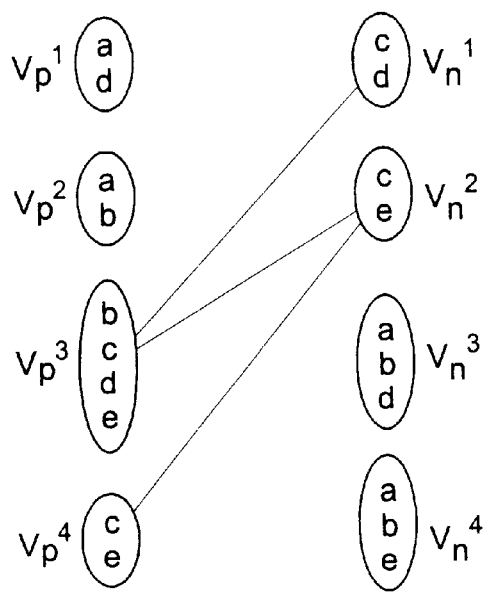
Figure 14F:
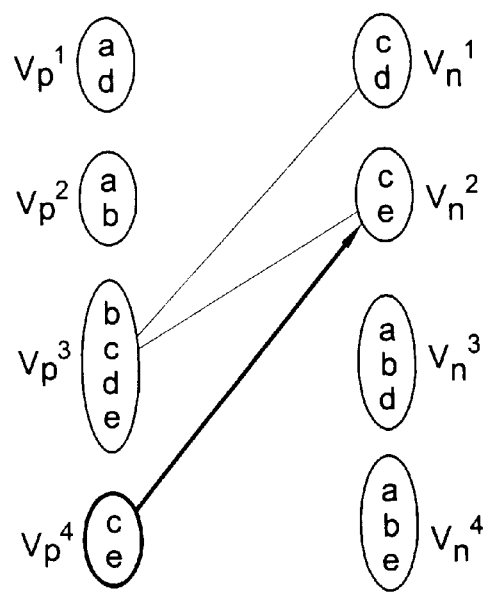
Figure 14G:
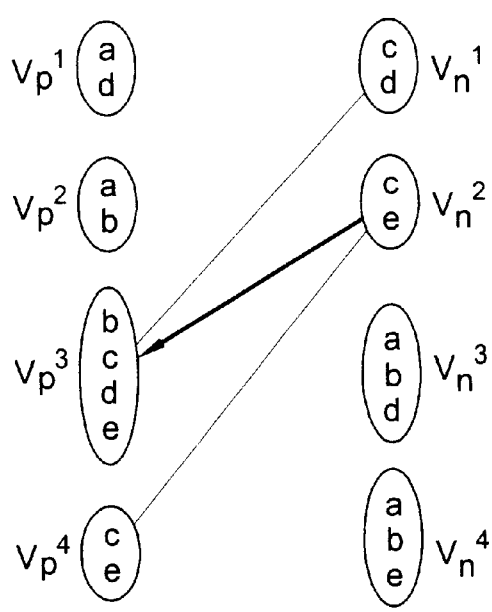
Figure 14H:
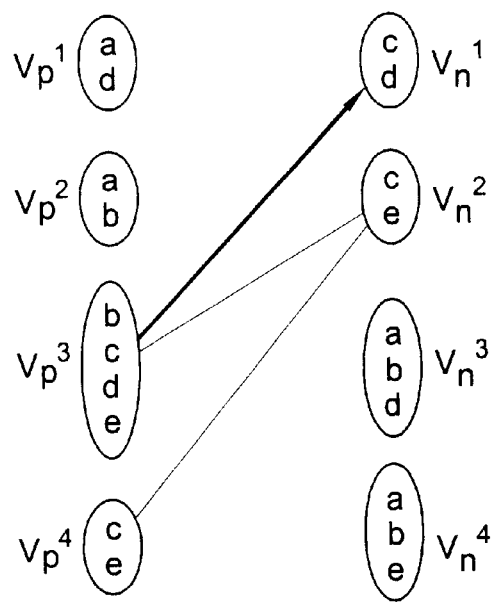
Figure 14I:
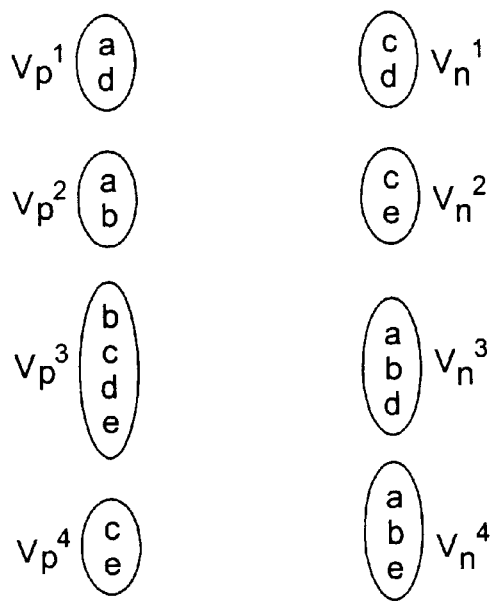

FIGS. 14a–i and 15a–k illustrate a second, alternative application of the constraint greedy walk portion of the chaining method described in connection with FIGS. 10–11 to the circuit depicted in FIGS. 5a and 6a–b. It is important to mention that FIGS. 14a–i and 15a–k are an alternative application of the chaining method applied in connection with FIGS. 12a–i and 13a–k. There would be no reason to run both, as application either results in an optimal layout (evident by comparing the final layouts illustrated in FIGS. 13k and 15k). The point of providing FIGS. 14a–i and 15a–k is to show that the precise layout of the circuit depicted in FIGS. 5a and 6a cannot be predicted; instead, what can be predicted is the optimality of the resulting solution. FIG. 14b shows that it is possible to select a different second node, relative to the node selected in FIG. 12b. Following that selection, two mutually exclusive edges are deleted at FIG. 14c (shown in dashed lines), differing from the edges deleted in FIG. 12c. The chaining method runs its course according FIG. 10, similarly as described in connection with FIGS. 12a–i, until no further edges exist in the bipartite graph and a final layout is obtained.

Figure 15A:
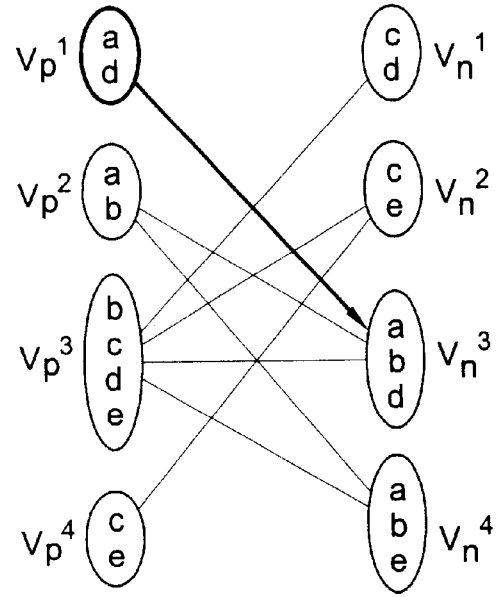
Figure 15B:
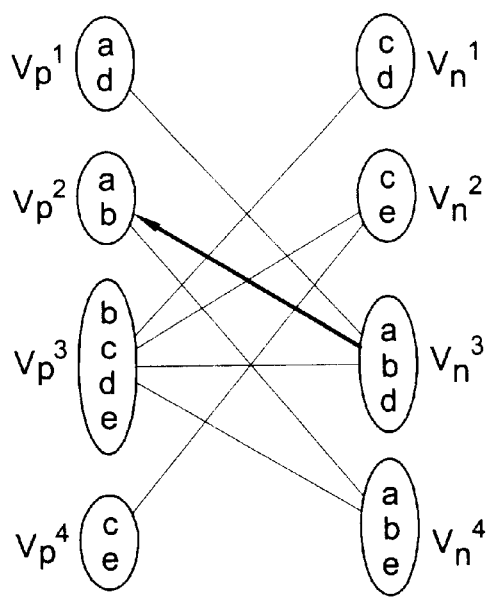
Figure 15C:
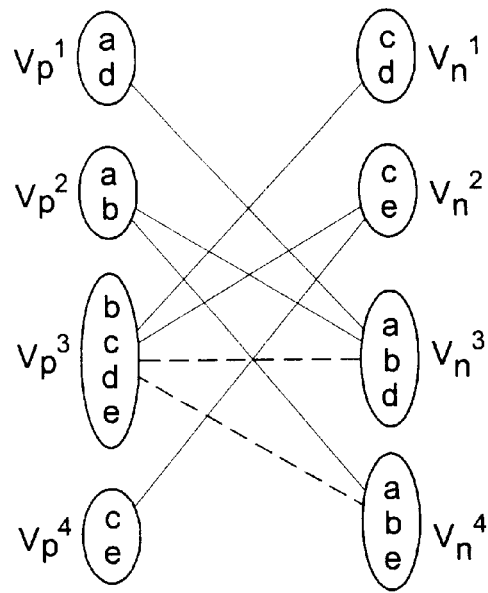
Figure 15D:
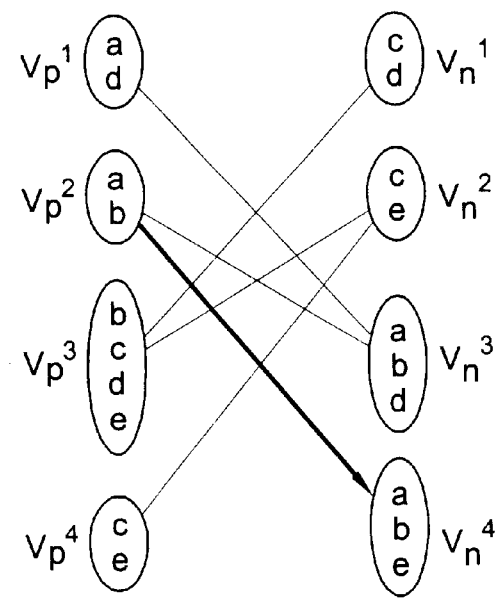
Figure 15E:
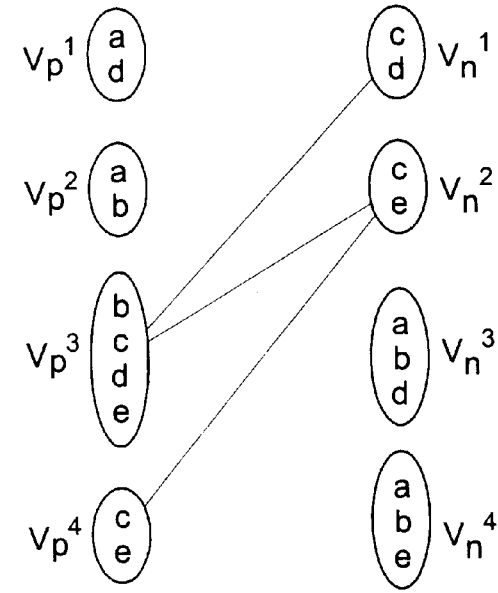
Figure 15F:
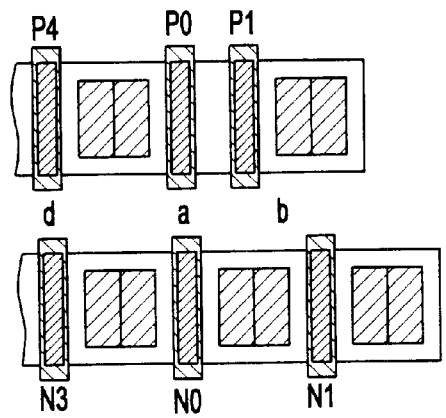
FIG. 15f is a partial alternative layout of the circuit depicted in FIGS. 5a and 6a obtained with the chaining method illustrated in FIGS. 10–11.
Figures 15G, 15H:
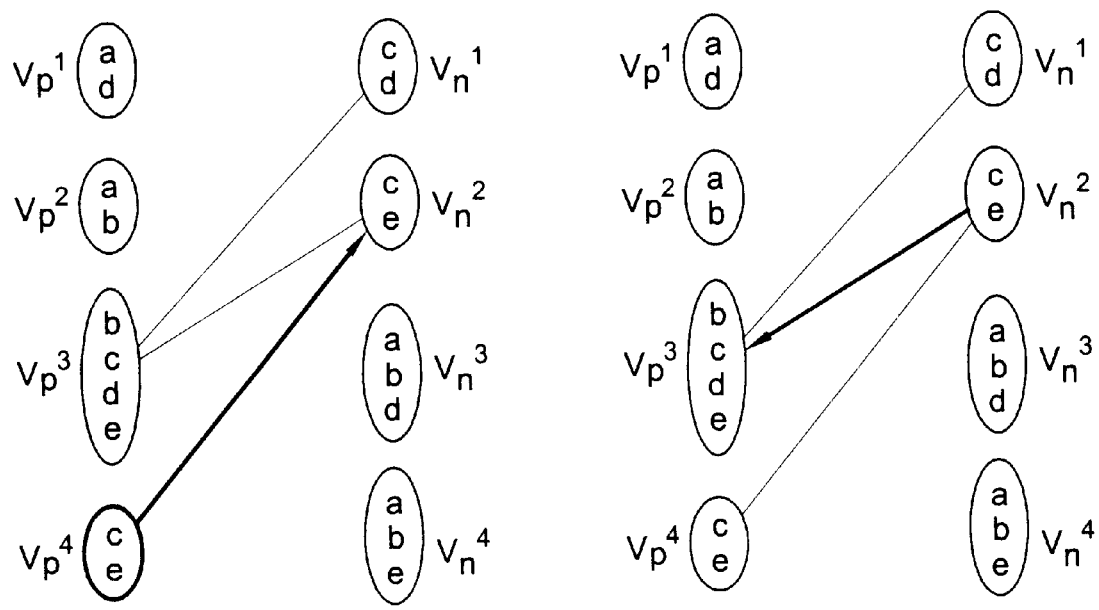
Figure 15K:
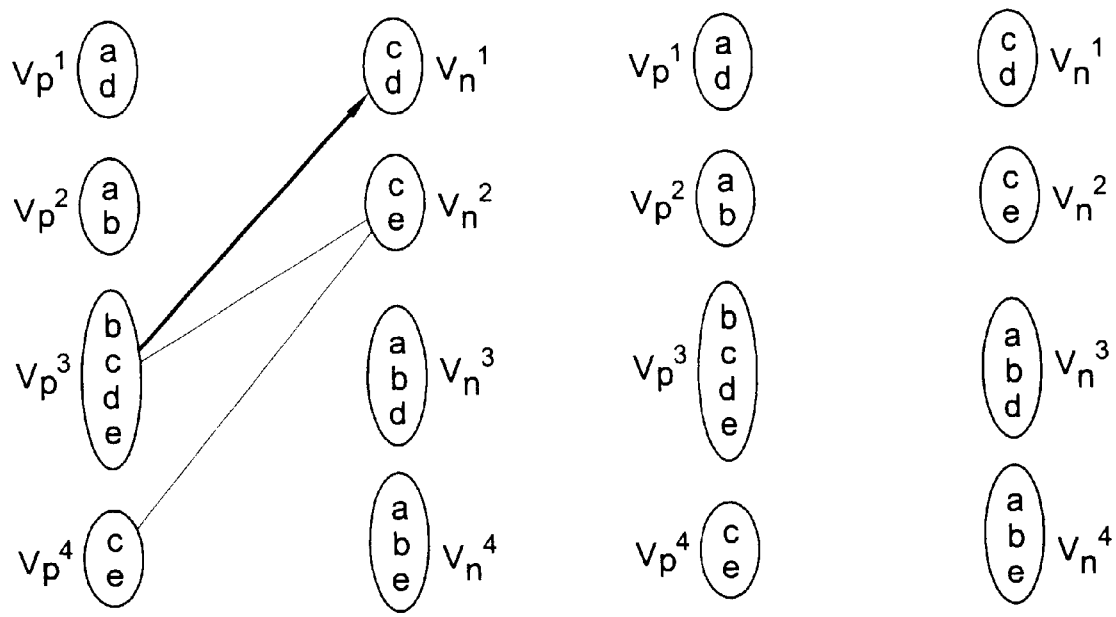
FIG. 15k is a complete alternative layout of the circuit depicted in FIGS. 5a and 6a obtained with the chaining method illustrated in FIGS. 10–11.
Figure 15K:
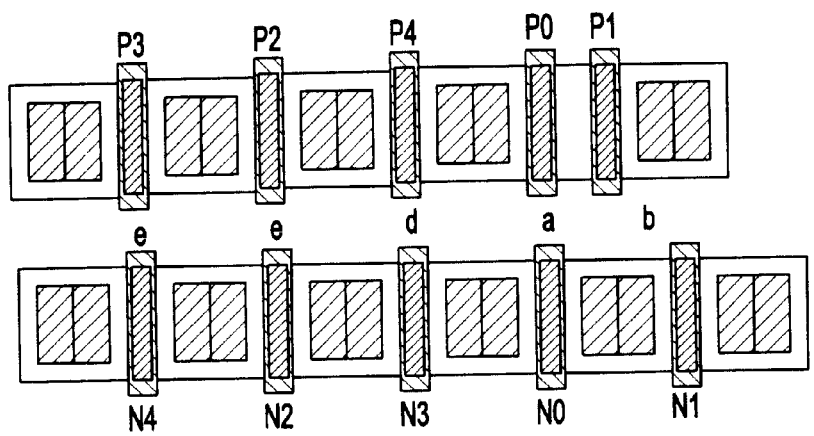

As before, FIGS. 15a–e are duplicative of FIGS. 14a–e, but FIG. 15f illustrates the point at which a layout is obtained and what the layout looks like. Thereafter, FIGS. 15g–j are duplicative of FIGS. 14f–i, but FIG. 15k illustrates what point at which an appended layout is obtained and what the final layout looks like. Note that the layout of FIG. 15f constitutes a portion of layout 424 of FIG. 5b, and that the final layout of FIG. 15k is the same as the layout 424 of FIG. 5b.

At least one novel aspect of the disclosed chaining method includes its ability to handle different types of MOS circuit topologies—including mixed-circuit topologies. A CMOS topology typically requires that a series circuit have a corresponding parallel circuit; therefore, an abutment between the two groups is guaranteed. A general topology does not guarantee this phenomenon, and the graph structure becomes more complex as a result. Without the carefully selected starting point at step 609 in FIG. 10, an optimal solution for such circuits cannot be obtained. Moreover, the disclosed chaining method includes an iterative capability at step 606 in FIG. 10. If a greedy walk happens upon an input that it cannot handle, it identifies and skips the problem area and continues chaining process until it fully consumes the graph, therefore generating a complete solution. Utilizing the disclosed method, any mixed-signal MOS circuit topology may be handled: any combination of MOS circuits, including CMOS, domino logic, and analog.

Another novel aspect of various disclosed chaining methods relates to the speed with which they obtain an optimized layout. By observing that the bipartite graph trail is similar to an Euler graph trail algorithm (namely, when the graph has vertices with an odd number of edges, a maximal graph trail starts and ends in such a node), an optimal solution may be found in linear time. Furthermore, the trivial trail (an isolated edge in the graph, which yields a trail of one edge) is necessarily postponed, in order to attempt to build a longer trail first. Applying careful selection of the starting point, the method generally ensures that each transistor is visited only once during chaining process according to a constraint-greedy walk through a bipartite graph. A single optimal solution is obtained without enumerating all the possible ones, resulting in a considerable speed advantage.

Figure 16A:
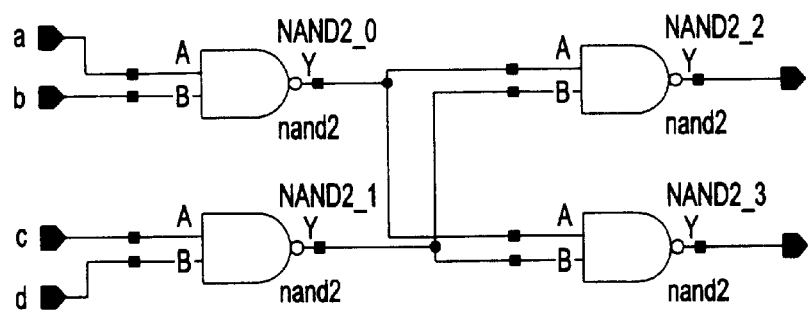
FIG. 16a is a circuit schematic for a third CMOS circuit.
Figure 16B:
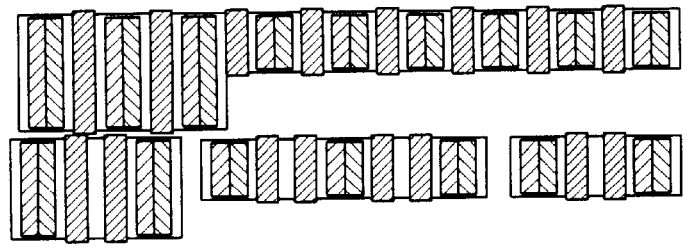
Figure 16C:
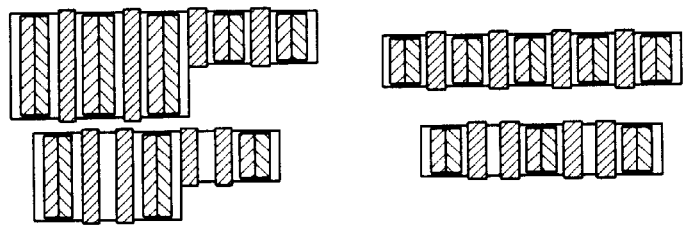
Figure 16D:
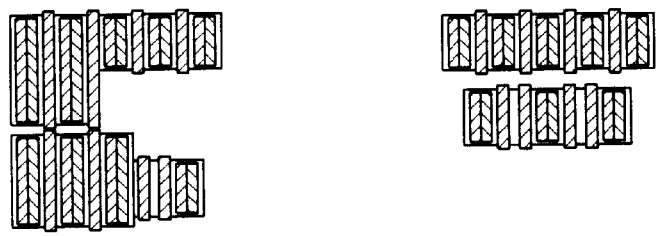

The disclosed chaining methods may be used in both customizing layouts (user-driven module generation and editing) and creating automated layouts (automated module generation) when enhanced with optional partitioning and/or folding capabilities. Interactive module generation and editing permits a user, for a selected set of components, to specify folding parameters for each device, and then generate the layout for the selected circuit. Parameters can be adjusted until a satisfactory layout is obtained. Preferably, a standard "point-and-click" cross-selection mechanism between schematic and layout is employed, permitting hierarchical structures to be selected in the schematic and portions of the hierarchy to be de-selected in the layout if their generation is not desired. In FIG. 16b–d, a number of interactive chaining and folding scenarios are presented for the circuit in FIG. 16a.

The layout in FIG. 16b shows the chain obtained for the entire circuit without requiring hierarchical partitioning. FIGS. 16c–d show two layouts obtained when the gates in the circuit have been manually partitioned vertically or horizontally respectively. Note that, in both layout examples, for each pair of NMOS and PMOS chains, the devices are ordered in such a way that all gates are aligned, hence gate routing can be completed in polysilicon. The devices are preferably abutted, requiring placement of contacts only where external connections are necessary. Otherwise, device contacts are preferably not created for the internal nets of the chain in order to minimize layout area.

Figure 17A:
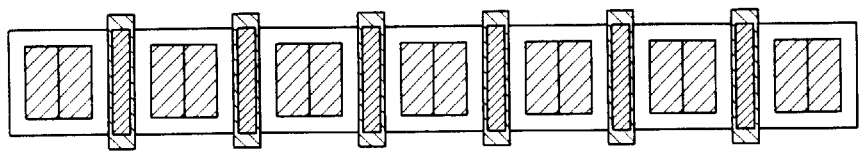
FIG. 17a is a layout for a fourth circuit having uniform height bounds.
Figure 17B:
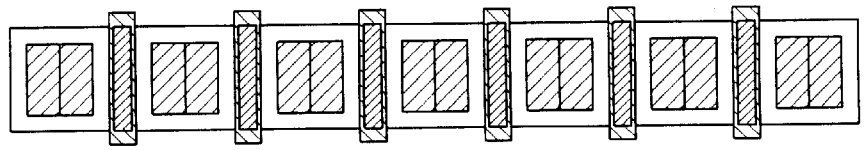
FIG. 17b is a layout for the circuit represented in FIG. 17a, but without uniform height bounds.

For the top chains in FIG. 16d, two possible folding scenarios are depicted in FIGS. 17a–b. Chain height bounds may be user-specified, such as in FIG. 17a, causing the layout will have a uniform height within these bounds and all the fingers of devices to have equal sizes. Alternatively, the number of fingers and the width of each device finger may be user defined, such as in FIG. 17b. This example shows the flexibility of the solution in using automatic chaining together with (a) automatic or (b) user defined folding.

Beside interactive layout editing, a chaining engine according to the present invention, enhanced with known folding capabilities, can be used to generate a layout automatically, starting from a connectivity source (netlist or schematic). The same optimization methods described above are used to generate the full layout. However, due to the size of the problems, fully chained layouts (even for small circuits like in FIG. 16a) might not be optimal for placement due to the impractical aspect ratio of the module obtained. Hence, the engine needs to partition the circuit before generating the chains.

A partitioning algorithm, part of the chaining engine as shown in FIG. 4, may generate a solution according to the following constraints, listed in descending order of priority:

1. Preserve circuit hierarchy as specified by the user, chaining together devices within the same logical hierarchy. For a heterogeneous design hierarchy, a preferred solution performs a bottom-up hierarchical partitioning. A user preferably specifies how many bottom-up hierarchical levels should be preserved by the partitioner. For example, gate level clustering is one hierarchical level of partitioning.

2. Scale the number of partitions linearly with the number of hierarchical partitions, independent of circuit size. The partitioning algorithm is preferably scalable linearly with the size of the circuit.

3. Partition the circuit with a maximum partition size, in case hierarchical partitioning cannot be performed. This feature helps reducing the size of the chains generated to reasonable form-factors, such that automated placement can still handle them.

Based on the above criteria, a 2×n partitioning algorithm may be adapted to accommodate these conditions. This algorithm is generalized from one well known in the art (Paul Stravers, "Partitioning a network into n pieces with a time-efficient net cost function," Proceedings of Design Automation Conference, IEEE 1991, pp. 177–182, which is incorporated herein by reference), over a number of n cuts with a cost function whose complexity is log(n). For a circuit of size p partitioned into n areas, the complexity of this algorithm has been demonstrated to be p×n log(n). Since the number of partitions n is fixed in our case for hierarchical circuits, the complexity of our implementation is linear with respect to circuit size p.

In a preferred partitioning implementation, a cost function attempts to minimize wire length and to equalize area or the number of devices per partition. Moreover, when hierarchy information is inherited from the connectivity source, the move space is reduced to the partitions in the same logical hierarchy. The partitioning algorithm works as follows. The bottom-up hierarchical partitioning is performed first, based on a user specification. For each partition in this step, optimized partitioning is performed in case the number of devices exceeds a size bound. After partitioning optimization, each partition is then submitted to the chaining module.

A preferred folding algorithm parses a chain of devices and performs a two step procedure as follows:

1. search for specific circuit topology patterns and apply a custom folding schema, or
2. fold devices individually in consecutive fingers in the chain using the device width bounds available.

Figure 18A:
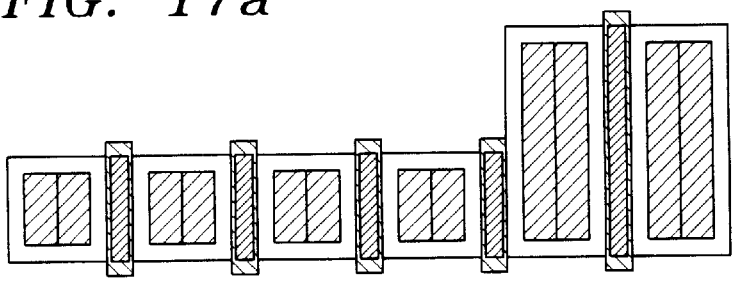
FIG. 18a illustrates two circuits of different topologies.
Figure 18A:
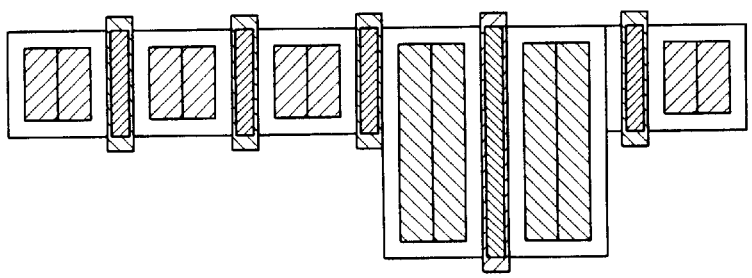
Figure 18A:
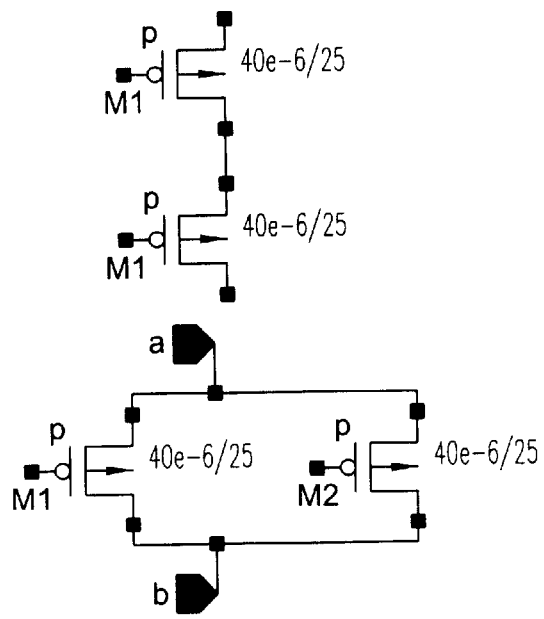
Figure 18B:
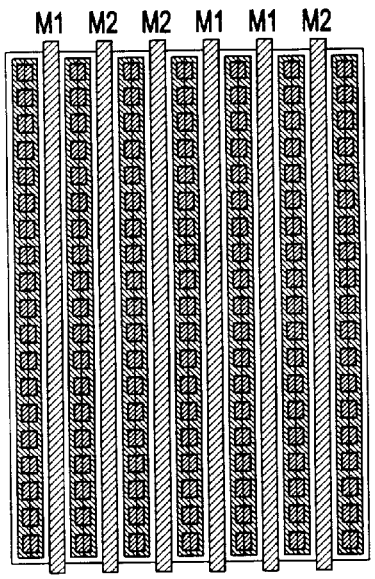
FIG. 18b is a layout for the circuits provided in FIG. 18a following a folding step.

In a preferred implementation, all the user-specified folding is also preserved. The custom topology patterns include parallel devices and pseudo-parallel devices. FIGS. 18a–b show the folding strategy for various circuit topologies. Note that pseudo-parallel nets (resulting by splitting devices in FIG. 18a) need not be routed when such a folded structure is created, because there is no current flow between the symmetrical branches of the circuit. The layout generated in the chaining engine is preferably annotated with this information. Given the interdigitated structure, such devices can be also folded with an even number of fingers.

While preferred embodiments of the invention have been described herein, many variations are possible which remain within the concept and scope of the invention. Such variations would become clear to one of ordinary skill in the art after inspection of the specification and the drawings. The invention therefore is not be to restricted except within the spirit and scope of any appended claims.

What is claimed is:

1. A method for automatically processing a circuit design, comprising:

obtaining a bipartite graph representing the a circuit design in nodes and edges;

selecting a starting node within the bipartite graph based on a node degree analysis; and performing walk through the bipartite graph to identify a paired NMOS and PMOS chain.

2. The method of claim 1, wherein the circuit is characterized by multiple topologies.

3. The method of claim 1, wherein the walk is completed in linear time relative to the complexity of the circuit.

4. The method of claim 1, wherein selecting a starting node within the bipartite graph based on the node degree analysis comprises:

determining whether one or more nodes in the bipartite graph has an odd degree;

determining whether one or more of the odd degree nodes has a bipartite edge traveling to another odd degree node; and selecting a lowest odd degree node having a bipartite edge traveling to another odd degree node as the starting node for the walk.

5. The method of claim 4, wherein no odd degree node has a bipartite edge traveling to another odd degree node, and wherein selecting a starting node within the bipartite graph based on the analysis further comprises:

selecting a lowest odd degree node as the starting node for the walk.

6. The method of claim 5, wherein no odd degree node is in the graph, and wherein selecting a starting node within the bipartite graph based on the analysis further comprises:

selecting a node having a bipartite edge as the starting node for the walk.

7. The method of claim 6, wherein no node with a bipartite edge is in the graph, and wherein selecting a starting node within the bipartite graph based on the analysis further comprises:

selecting a node having at least one edge connected to the node as the starting node for the walk.

8. The method of claim 1, wherein obtaining a bipartite graph further comprises:

automatically identifying essential edges and mutually exclusive edges; and automatically annotating the essential edges and the mutually exclusive edges in the bipartite graph.

9. The method of claim 1, wherein performing the walk through the bipartite graph comprises:

selecting an edge from the starting node.

10. The method of claim 9, wherein selecting an edge further comprises:

determining whether any bipartite edges are present in the bipartite graph; and if any bipartite edges are present, then selecting one of the bipartite edges to continue the walk.

11. The method of claim 10, wherein selecting one of the bipartite edges further comprises:

selecting an essential edge.

12. The method of claim 9, wherein no bipartite edges are present, and wherein performing the walk further comprises:

selecting a non-bipartite edge to continue the walk; and continuing the walk with non-bipartite edges until none are available.

13. The method of claim 9, wherein performing the walk further comprises:

adding the selected edge to the chain; and deleting mutually exclusive edges of the selected edge from the graph.

14. The method of claim 1, wherein performing the walk comprises:

determining that no edge can be selected from the starting node; and returning the completed chain from the walk.

15. The method of claim 14, further comprising:

deleting edges visited during the walk from the graph.

16. The method of claim 1, further comprising:

after the walk is completed, initiating at least one additional walk through the bipartite graph for the remaining graph edges to optimize the remaining chains in the circuit; and laying out the circuit design based on the optimized chains.

17. An apparatus for automatically processing a circuit design, comprising:

means for obtaining a bipartite graph representing the circuit design in nodes and edges;

means for selecting a starting node within the bipartite graph based on a node degree analysis; and means for performing a walk through the bipartite graph to identify a paired NMOS and PMOS chain.

18. The apparatus of claim 17, wherein said means for selecting a starting node within the bipartite graph based on the node degree analysis comprises:

means for determining whether one or more nodes in the bipartite graph has an odd degree;

means for determining whether one or more of the odd degree nodes has a bipartite edge traveling to another odd degree node; and means for selecting a lowest odd degree node having a bipartite edge traveling to another odd degree node as the starting node for the walk.

19. The apparatus of claim 17, wherein said means for obtaining a bipartite graph further comprises:

means for automatically identifying essential edges and mutually exclusive edges; and means for automatically annotating the essential edges and the mutually exclusive edges in the bipartite graph.

20. A computer readable medium storing computer executable code comprising:

code to obtain a bipartite graph representing a circuit design in nodes and edges;

code to select a starting node within the bipartite graph based on a node degree analysis; and code to perform a walk through the bipartite graph to identify a paired NMOS and PMOS chain.

21. The medium of claim 20, wherein the code to select a starting node within the bipartite graph based on the node degree analysis comprises:

code to determine whether one or more nodes in the bipartite graph has an odd degree;

code to determine whether one or more of the odd degree nodes has a bipartite edge traveling to another odd degree node; and code to select a lowest odd degree node having a bipartite edge traveling to another odd degree node as the starting node for the walk.

22. The medium of claim 20, wherein the code obtain a bipartite graph further comprises:

code to automatically identify essential edges and mutually exclusive edges; and code to automatically annotate the essential edges and the mutually exclusive edges in the bipartite graph.

23. A method for automatically processing a circuit design, comprising:

obtaining a bipartite graph representing the circuit design in nodes and edges;

automatically identifying essential edges and mutually exclusive edges in the bipartite graph;

selecting a starting node within the bipartite graph; and performing a walk through the bipartite graph to identify a paired NMOS and PMOS chain.

24. The method of claim 23, further comprising:

automatically annotating the essential edges and the mutually exclusive edges in the bipartite graph.

25. The method of claim 23, wherein selecting further comprises:

selecting the starting node within the bipartite graph based on a node degree analysis.

* * * * *

UNITED STATES PATENT AND TRADEMARK OFFICE
CERTIFICATE OF CORRECTION

PATENT NO.   : 6,671,866 B2
DATED        : December 30, 2003
INVENTOR(S)  : Bodgan Arsintescu It is certified that error appears in the above-identified patent and that said Letters Patent is hereby corrected as shown below:

Drawings,
Replacement pages 4 and 5 which includes Figures 4, 5a, 5b, 6a, 6b and 7 are attached hereto.

Signed and Sealed this

Fourteenth Day of September, 2004

JON W. DUDAS
*Director of the United States Patent and Trademark Office*

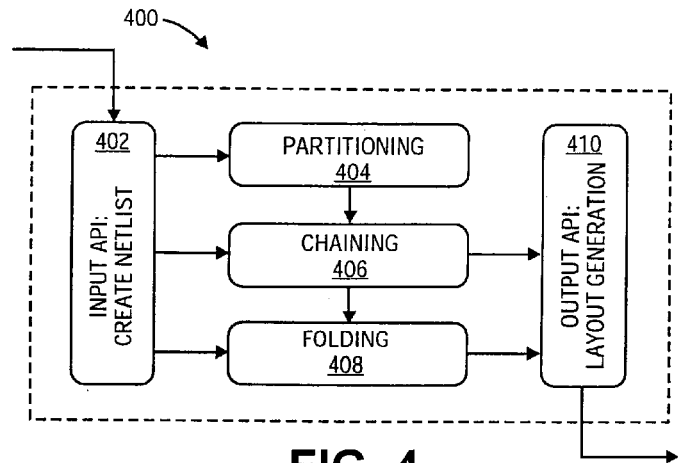
FIG. 4
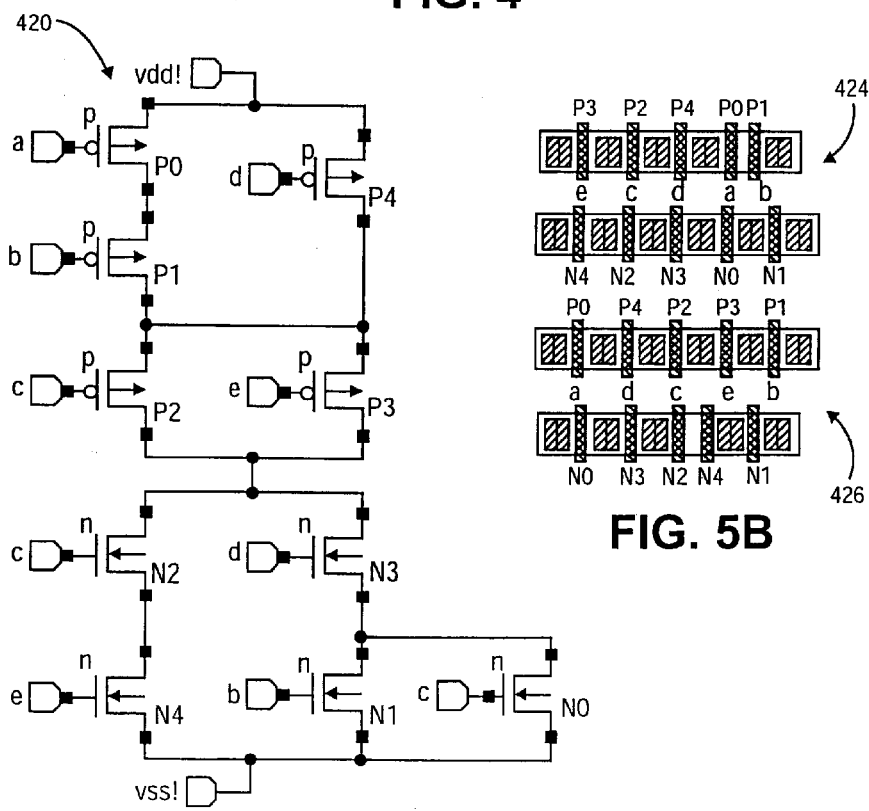
FIG. 5B
FIG. 5A

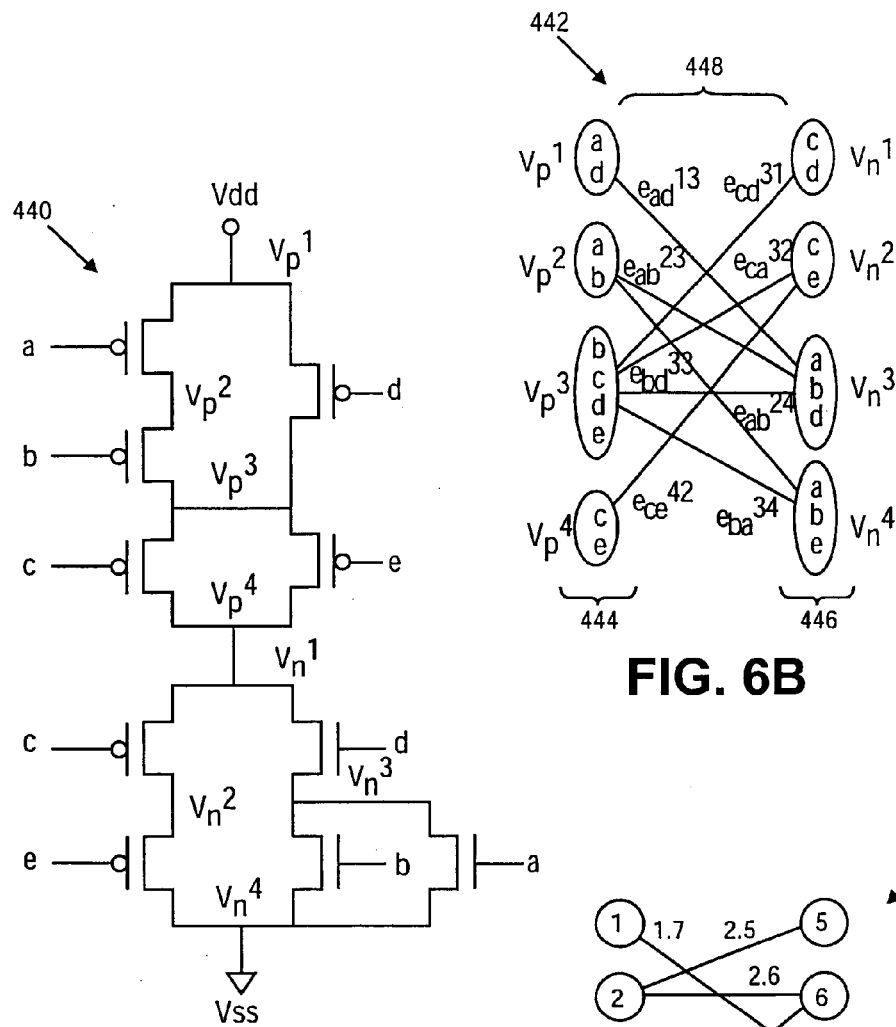
FIG. 6A
FIG. 6B
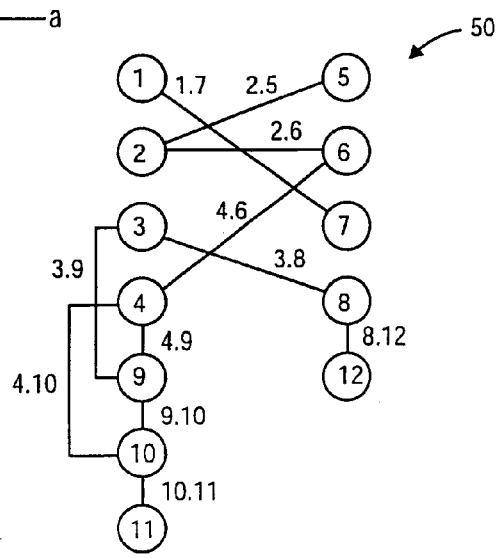
FIG. 7